US010170232B2

(12) United States Patent
Li et al.

(10) Patent No.: US 10,170,232 B2
(45) Date of Patent: Jan. 1, 2019

(54) TOROID INDUCTOR WITH REDUCED ELECTROMAGNETIC FIELD LEAKAGE

(71) Applicant: QUALCOMM Incorporated, San Diego, CA (US)

(72) Inventors: Yue Li, San Diego, CA (US); Charles David Paynter, Encinitas, CA (US); Ryan David Lane, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/931,659

(22) Filed: Nov. 3, 2015

(65) Prior Publication Data

US 2017/0125152 A1 May 4, 2017

(51) Int. Cl.
*H01F 27/28* (2006.01)
*H01F 27/29* (2006.01)
(Continued)

(52) U.S. Cl.
CPC ..... *H01F 27/2804* (2013.01); *H01F 17/0013* (2013.01); *H01F 17/02* (2013.01);
(Continued)

(58) Field of Classification Search
CPC ........ H01F 27/2804; H01F 27/29; H05K 1/18
(Continued)

(56) References Cited

U.S. PATENT DOCUMENTS 5,055,816 A * 10/1991 Altman ............... H01F 17/0033
29/602.1

7,375,611 B1 * 5/2008 Pleskach ............. H01F 27/2804
336/229

(Continued)

FOREIGN PATENT DOCUMENTS

DE         10338471 A1    3/2005
EP         0778593 A1     6/1997
JP         S62176111 A    8/1987

OTHER PUBLICATIONS

TDK SPM Magnetic Shield Type Wound Inductors, SPM Magnetic Shield Type Inductors—TDK, Mouser, Retrieved date on Jul. 31, 2015, URL: http://www.mouser.com/new/tdk/tdk-spm-inductors/ >, 2 Pages.

(Continued)

*Primary Examiner* — Elvin G Enad
*Assistant Examiner* — Kazi Hossain
(74) *Attorney, Agent, or Firm* — Loza & Loza, LLP/Qualcomm

(57) ABSTRACT

A toroid inductor includes a plurality of first turns configured in a first ring shape and a plurality of second turns configured in a second ring shape. The plurality of first turns includes a plurality of first upper interconnects, a plurality of first lower interconnects, and a plurality of first vias coupled to the plurality of first upper interconnects and to the plurality of first lower interconnects. The plurality of second turns is at least partially intertwined with the plurality of first turns. The plurality of second turns includes a plurality of second upper interconnects, a plurality of second lower interconnects, and a plurality of second vias coupled to the plurality of second upper interconnects and to the plurality of second lower interconnects.

16 Claims, 14 Drawing Sheets

(51) Int. Cl.
- *H01L 27/08* (2006.01)
- *H01F 41/04* (2006.01)
- *H05K 1/18* (2006.01)
- *H01F 17/00* (2006.01)
- *H01F 17/02* (2006.01)

(52) U.S. Cl.
CPC ........... *H01F 27/29* (2013.01); *H01F 41/041* (2013.01); *H05K 1/18* (2013.01); *H01F 2027/2809* (2013.01)

(58) Field of Classification Search
USPC ........ 336/223, 192, 229, 200, 232; 361/748; 257/531
See application file for complete search history.

(56) References Cited

U.S. PATENT DOCUMENTS

| | | | |
|---|---|---|---|
| 7,518,248 B2 | 4/2009 | Li et al. | |
| 7,642,890 B2 | 1/2010 | Lee | |
| 8,276,259 B1 | 10/2012 | Findley et al. | |
| 8,826,514 B2 | 9/2014 | Papavasiliou et al. | |
| 2004/0135662 A1* | 7/2004 | Harding | H01F 17/0006 336/229 |
| 2006/0176139 A1* | 8/2006 | Pleskach | H01F 17/0033 336/223 |
| 2008/0001698 A1* | 1/2008 | Hazucha | H01F 17/0033 336/200 |
| 2009/0273428 A1* | 11/2009 | Chen | H01F 17/0033 336/200 |
| 2013/0257577 A1* | 10/2013 | Nazarian | H01F 5/003 336/200 |
| 2014/0043130 A1 | 2/2014 | Dalmia et al. | |
| 2014/0127944 A1* | 5/2014 | Dinh | H01F 17/06 439/620.25 |
| 2014/0247269 A1* | 9/2014 | Berdy | H01F 1/24 345/501 |
| 2014/0266549 A1* | 9/2014 | Huang | H01F 27/2804 336/200 |
| 2015/0206837 A1* | 7/2015 | Gu | H01L 23/5389 257/531 |
| 2015/0332840 A1* | 11/2015 | Yazaki | H01F 27/2804 336/192 |

OTHER PUBLICATIONS

International Search Report and Written Opinion—PCT/US2016/060168—ISA/EPO—dated Jan. 25, 2017.

* cited by examiner

Toroid Inductor

Bottom Interconnects
PLAN VIEW

Bottom Interconnects + Via
PLAN VIEW

Upper Interconnects + Via
PLAN VIEW

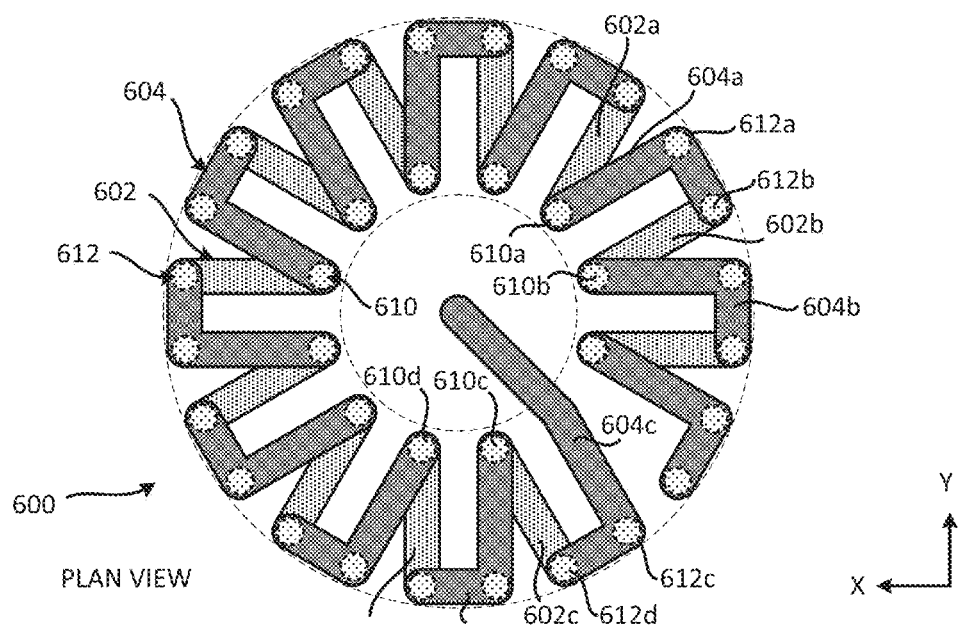
FIG. 6
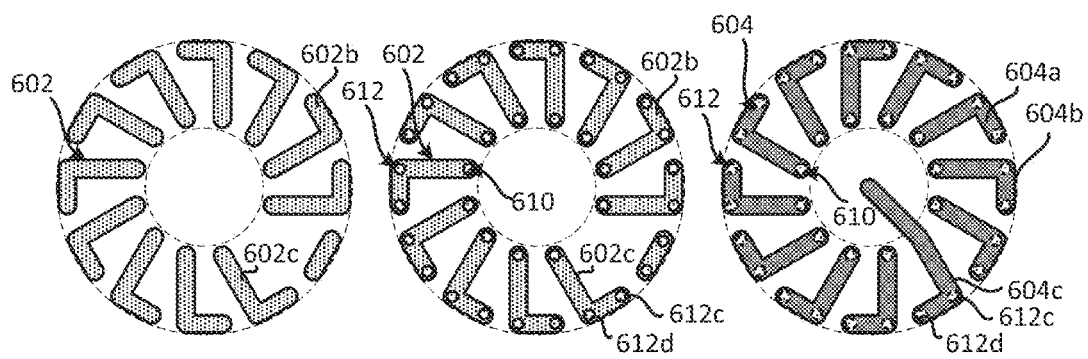
Bottom Interconnects
PLAN VIEW
FIG. 7
Bottom Interconnects + Via
PLAN VIEW
FIG. 8
Upper Interconnects + Via
PLAN VIEW
FIG. 9

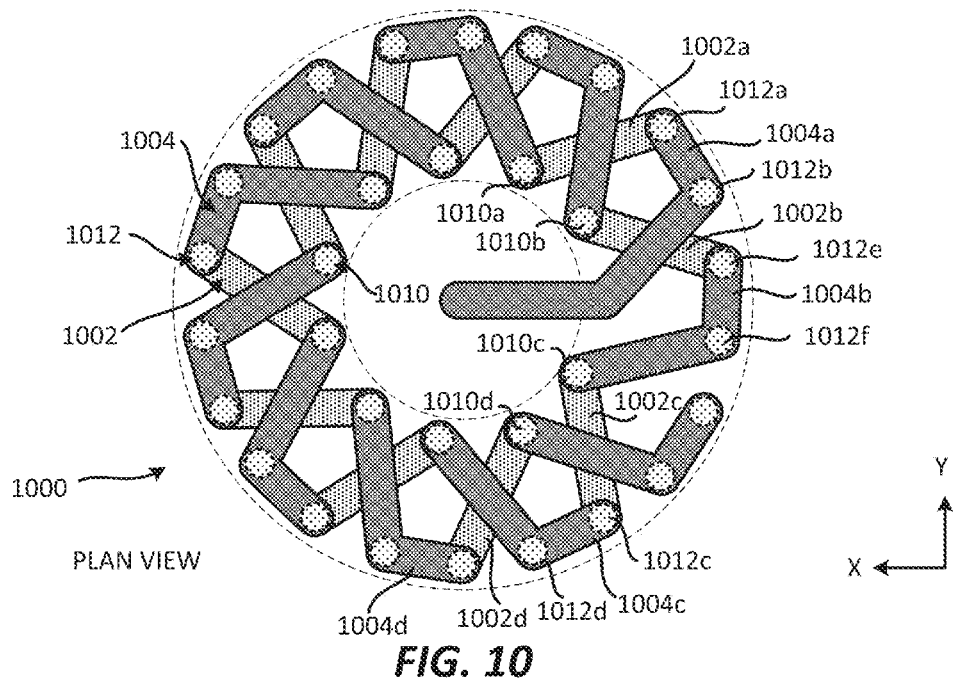
FIG. 10
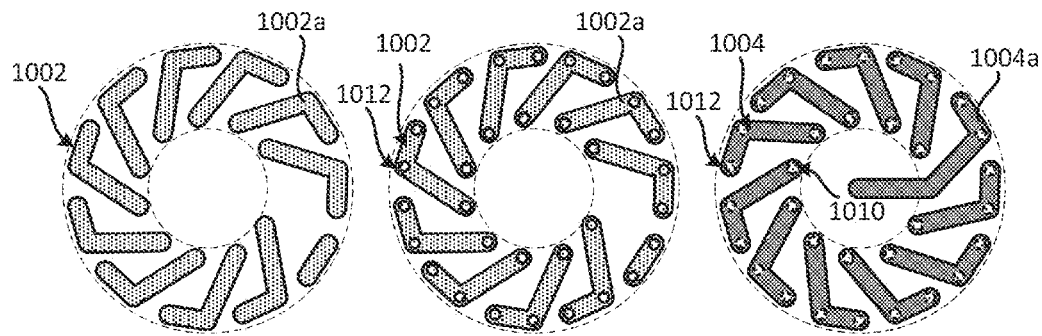
Bottom Interconnects
PLAN VIEW
FIG. 11
Bottom Interconnects + Via
PLAN VIEW
FIG. 12
Upper Interconnects + Via
PLAN VIEW
FIG. 13

TOROID INDUCTOR WITH REDUCED ELECTROMAGNETIC FIELD LEAKAGE

BACKGROUND

Field

Various features relate to an inductor, and more specifically to a toroid inductor with reduced electromagnetic field leakage.

Background

FIG. 1 illustrates a toroid inductor 100. The toroid inductor 100 may be implemented in an integrated device. The toroid inductor 100 includes a plurality of first interconnects 102, a plurality of second interconnects 104, a plurality of first vias 110, and a plurality of second vias 112.

The plurality of first interconnects 102 includes at least interconnects 102a-102d. The plurality of first interconnects 102 may be lower interconnects or bottom interconnects of the toroid inductor 100. The plurality of second interconnects 104 includes at least interconnects 104a-104d. The plurality of second interconnects 104 may be upper interconnects or top interconnects of the toroid inductor 100. The plurality of first vias 110 includes at least vias 110a-110d. The plurality of first vias 110 may be vias (e.g., inner vias) that define an inner boundary or inner perimeter of the toroid inductor 100. The plurality of first vias 110 is coupled to the plurality of first interconnects 102 and the plurality of second interconnects 104. The plurality of second vias 112 includes at least vias 112a-112d. The plurality of second vias 112 may be vias (e.g., outer vias) that define an outer boundary or outer perimeter of the toroid inductor 100. The plurality of second vias 112 is coupled to the plurality of first interconnects 102 and the plurality of second interconnects 104.

The toroid inductor 100 is a one loop toroid inductor. While the toroid inductor 100 may have a higher inductance and/or a higher quality factor (Q factor) than other types of inductors (e.g., spiral inductor), the toroid inductor 100 does have limitations. For example, there is electromagnetic field that leaks from the toroid inductor 100, which may cause electromagnetic interference (EMI). In some instances, the amount of electromagnetic field leakage can be substantial enough to cause an electromagnetic interference (EMI) that is powerful enough to adversely affect nearby electronic circuits.

Therefore, there is a need for an inductor with better inductance, better quality factor, less electromagnetic field leakage, and radiates less electromagnetic interference (EMI). Such an inductor may be implemented in an integrated circuit (IC) module, an integrated circuit (IC) package, a die, a substrate and/or a printed circuit board (PCB), while at the same time meeting the needs and/or requirements of mobile computing devices and/or wearable computing devices.

SUMMARY

Various features relate to an inductor, and more specifically to a toroid inductor with reduced electromagnetic field leakage.

One example provides a toroid inductor that includes a plurality of first turns configured in a first ring shape and a plurality of second turns configured in a second ring shape. The plurality of first turns includes a plurality of first upper interconnects, a plurality of first lower interconnects, and a plurality of first vias coupled to the plurality of first upper interconnects and to the plurality of first lower interconnects. The plurality of second turns is at least partially intertwined with the plurality of first turns. The plurality of second turns includes a plurality of second upper interconnects, a plurality of second lower interconnects, and a plurality of second vias coupled to the plurality of second upper interconnects and to the plurality of second lower interconnects.

Another example provides a toroid inductor that includes a plurality of first turns configured in a first ring shape. The plurality of first turns includes a plurality of first upper interconnects, a plurality of first lower interconnects, and a plurality of first vias coupled to the plurality of first upper interconnects and to the plurality of first lower interconnects. The plurality of first turns includes a first turn. The first turn includes a first inner via, a first upper interconnect coupled to the first inner via, a first outer via coupled to the first upper interconnect, a second outer via coupled to the first upper interconnect, and a first lower interconnect coupled to the first outer via and the second outer via.

Another example provides a method for fabricating a toroid inductor in an integrated device. The method forms a plurality of first turns in at least a dielectric layer such that the plurality of first turns is configured in a first ring shape. Forming the plurality of first turns includes providing the dielectric layer; forming a plurality of first upper interconnects over a first surface of the dielectric layer; forming a plurality of first lower interconnects over a second surface of the dielectric layer; and forming a plurality of first vias in the dielectric layer such that the plurality of first vias is coupled to the plurality of first upper interconnects and to the plurality of first lower interconnects. The method forms a plurality of second turns in at least the dielectric layer, such that the plurality of second turns is at least partially intertwined with the plurality of first and is configured in a second ring shape. Forming the plurality of second turns includes forming a plurality of second upper interconnects over the first surface of the dielectric layer; forming a plurality of second lower interconnects over the second surface of the dielectric layer; and forming a plurality of second vias in the dielectric layer, such that plurality of second vias is coupled to the plurality of second upper interconnects and to the plurality of second lower interconnects.

DRAWINGS

Various features, nature and advantages may become apparent from the detailed description set forth below when taken in conjunction with the drawings in which like reference characters identify correspondingly throughout.

FIG. 6 illustrates a plan view of a toroid inductor comprising multiple outer vias in turns.

FIG. 7 illustrates a plan view of lower interconnects of a toroid inductor.

FIG. 8 illustrates a plan view of lower interconnects and vias of a toroid inductor.

FIG. 9 illustrates a plan view of upper interconnects and vias of a toroid inductor.

FIG. 10 illustrates a plan view of a toroid inductor comprising intertwined interconnects.

FIG. 11 illustrates a plan view of lower interconnects of a toroid inductor.

FIG. 12 illustrates a plan view of lower interconnects and vias of a toroid inductor.

FIG. 13 illustrates a plan view of upper interconnects and vias of a toroid inductor.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

The present disclosure describes a toroid inductor that includes a plurality of first turns configured in a first ring shape and a plurality of second turns configured in a second ring shape. The plurality of first turns includes a plurality of first upper interconnects, a plurality of first lower interconnects, and a plurality of first vias coupled to the plurality of first upper interconnects and to the plurality of first lower interconnects. The plurality of second turns is at least partially intertwined with the plurality of first turns. The plurality of second turns includes a plurality of second upper interconnects, a plurality of second lower interconnects, and a plurality of second vias coupled to the plurality of second upper interconnects and to the plurality of second lower interconnects.

Exemplary Tumid Inductor with Reduced Electromagnetic Field Leakage

Figure 2:
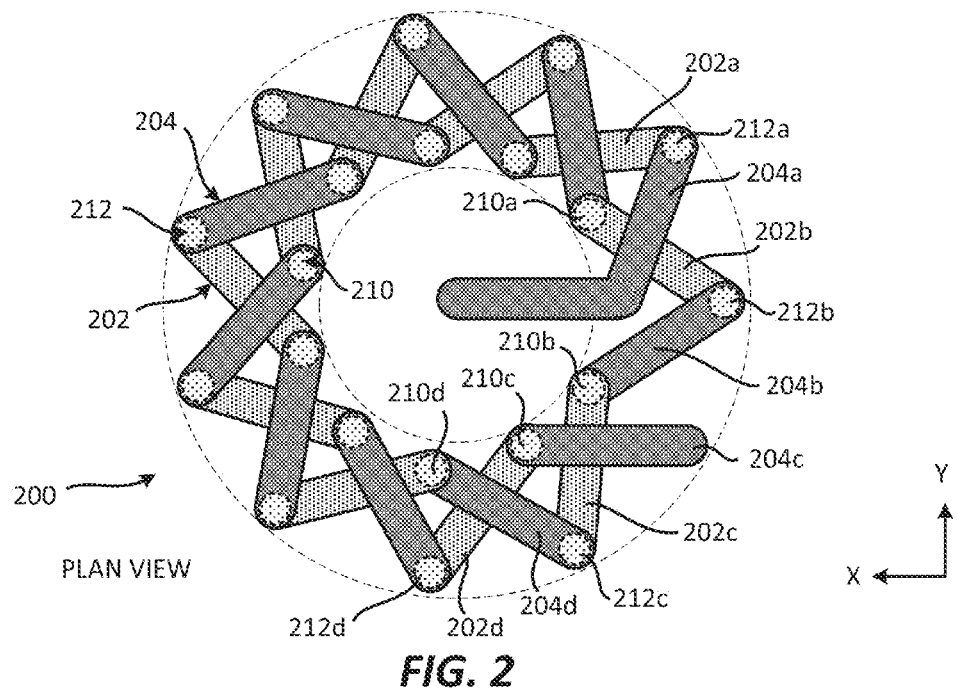
FIG. 2 illustrates a plan view of a toroid inductor comprising intertwined interconnects.

FIG. 2 illustrates an example of a toroid inductor 200. The toroid inductor 200 includes a plurality of turns that are intertwined. The intertwining of at least some of the turns of the toroid inductor 200 creates a built-in enclosure that helps reduce and minimize the electromagnetic field that leaks from the toroid inductor 200. The toroid inductor 200 may be implemented in an integrated device, an integrated circuit (IC) module, an integrated circuit (IC) package, a die, a substrate, an interposer and/or a printed circuit board (PCB).

The toroid inductor 200 includes a plurality of first interconnects 202, a plurality of second interconnects 204, a plurality of first vias 210, and a plurality of second vias 212. The toroid inductor 200 includes a plurality of turns that are defined by the plurality of first interconnects 202, the plurality of second interconnects 204, the plurality of first vias 210, and the plurality of second vias 212. The toroid inductor 200 may be an inductive means.

The plurality of first interconnects 202 includes the interconnects 202a-202d. The plurality of first interconnects 202 may be lower interconnects or bottom interconnects of the toroid inductor 200. The plurality of first interconnects 202 may include traces (e.g., lower traces). The plurality of second interconnects 204 includes the interconnects 204a-204d. The plurality of second interconnects 204 may be upper interconnects or top interconnects of the toroid inductor 200. The plurality of second interconnects 204 may include traces (e.g., upper traces).

The plurality of first vias 210 includes the vias 210a-210d. The plurality of first vias 210 may be vias (e.g., inner vias) that define an inner boundary or inner perimeter of the toroid inductor 200. The plurality of first vias 210 is coupled to the plurality of first interconnects 202 and the plurality of second interconnects 204. The plurality of second vias 212 includes the vias 212a-212d. The plurality of second vias 212 may be vias (e.g., outer vias) that define an outer boundary or outer perimeter of the toroid inductor 200. The plurality of second vias 212 is coupled to the plurality of first interconnects 202 and the plurality of second interconnects 204.

The toroid inductor 200 includes several turns. In some implementations, a turn of the toroid inductor 200 includes an inner via 210b), a lower interconnect interconnect 202c), an outer via (e.g., via 212e), and an upper interconnect (e.g., the interconnect 204d). The via 210b is coupled to the interconnect 202c. The interconnect 202c is coupled to the via 212c. The via 212c is coupled to the interconnect 202d, which in some implementations, defines a turn (e.g., first turn) of the toroid inductor 200. Another turn (e.g., second turn) of the toroid inductor 200 may be defined by the interconnect 204c, the via 210c, the interconnect 202d, and the via 212d. The interconnect 204c is coupled to the via 210c. The via 210c is coupled to the interconnect 202d. The interconnect 202d is coupled to the via 212d.

As shown in FIG. 2, the toroid inductor 200 is formed by, several turns that are intertwined with each other. For example, a turn (e.g., first turn) that is defined by the via 210b, the interconnect 202c, the via 212c, and the interconnect 204d, is intertwined with another turn (e.g., second turn) that is defined by the interconnect 204c, the via 210c, the interconnect 202d, and the via 212d.

As mentioned above, the intertwining of the turns of the toroid inductor 200 creates a built-in enclosure that helps reduce and minimize the electromagnetic field that leaks from the toroid inductor 200, which consequently reduces the electromagnetic interference (EMI) that the toroid inductor 200 may have on nearby electronic circuits (e.g., dies). As a result, the toroid inductor 200 may be positioned closer to electronic circuits (e.g., dies) without the toroid inductor adversely affecting the nearby electronic circuits. The end result of all of this is a much smaller device (e.g., mobile device, wearable device) that includes a toroid inductor and electronic circuits.

Another advantage of the toroid inductor 200 is its overall better quality factor (Q value) and/or inductance value, in comparison to a comparable sized inductor. Exemplary Q values and inductances values for various toroid inductors are further described below in Table 1.

Figure 3:
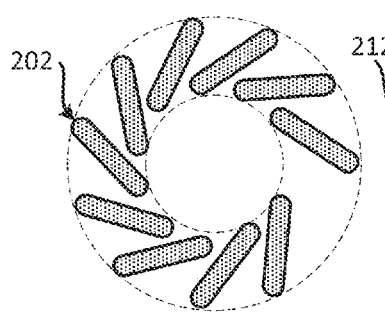
FIG. 3 illustrates a plan view of lower interconnects of a toroid inductor.

FIG. 3 illustrates a plan view (e.g., top view) of the plurality of first interconnects 202 that define the toroid inductor 200. In some implementations, the plurality of first interconnects 202 may be interconnects (e.g., traces) on a first metal layer of a substrate, an interposer and/or a printed circuit board (PCB).

Figure 4:
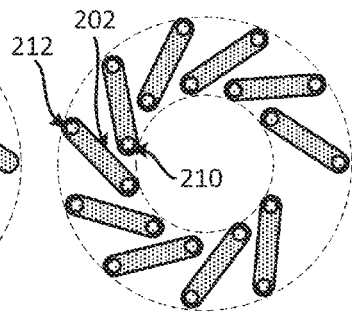
FIG. 4 illustrates a plan view of lower interconnects and vias of a toroid inductor.

FIG. 4 illustrates a plan view (e.g., top view) of the plurality of first vias 210 and the plurality of second vias 212 that are formed over the plurality of first interconnects 202. In some implementations, the plurality of first vias 210 and the plurality of second vias 212 may be vias that traverse a substrate, an interposer and/or a printed circuit board (PCB).

Figure 5:
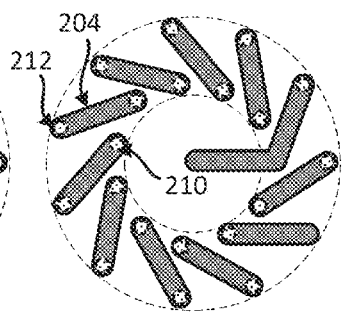
FIG. 5 illustrates a plan view of upper interconnects and vias of a toroid inductor.

FIG. 5 illustrates a plan view (e.g., top view) of the plurality of second interconnects 204 that define the toroid inductor 200. The plurality of second interconnects 204 are formed over the plurality of first vias 210 and the plurality of second vias 212. In some implementations, the plurality of second interconnects 204 may be interconnects (e.g., traces) on a second metal layer of a substrate, an interposer and/or a printed circuit board (PCB).

Different implementations may use different toroid inductor designs and toroid inductor structures to reduce electromagnetic field leakage. These different toroid inductor designs and toroid inductor structures are further described below.

Exemplary Tumid Inductor with Reduced Electromagnetic Field Leakage

FIG. 6 illustrates an example of a toroid inductor 600. As will be further described below, the toroid inductor 600 includes a design and structure that creates a built-in enclosure that helps reduce and minimize the electromagnetic field that leaks from the toroid inductor 600. The toroid inductor 600 may be implemented in an integrated device, an integrated circuit (IC) module, an integrated circuit (IC) package, a die, a substrate, an interposer and/or a printed circuit board (PCB).

The toroid inductor 600 includes a plurality of first interconnects 602, a plurality of second interconnects 604, a plurality of first vias 610, and a plurality of second vias 612. The toroid inductor 600 may be an inductive means.

The plurality of first interconnects 602 includes the interconnects 602a-602d. The plurality of first interconnects 602 may be lower interconnects or bottom interconnects of the toroid inductor 600. The plurality of first interconnects 602 may include traces (e.g., lower traces). One or more interconnects from the plurality of first interconnects 602 may include an L shape or an approximate L shape.

The plurality of second interconnects 604 includes the interconnects 604a-604d. The plurality of second interconnects 604 may be upper interconnects or top interconnects of the toroid inductor 600. The plurality of second interconnects 604 may include traces (e.g., upper traces). One or more interconnects from the plurality of second interconnects 604 may include an L shape or an approximate L shape.

The plurality of first vias 610 includes the vias 610a-610d. The plurality of first vias 610 may be vias (e.g., inner vias) that define an inner boundary or inner perimeter of the toroid inductor 600. The plurality of first vias 610 is coupled to the plurality of first interconnects 602 and the plurality of second interconnects 604. The plurality of second vias 612 includes the vias 612a-612d. The plurality of second vias 612 may be vias (e.g., outer vias) that define an outer boundary or outer perimeter of the toroid inductor 600. The plurality of second vias 612 is coupled to the plurality of first interconnects 602 and the plurality of second interconnects 604.

The toroid inductor 600 includes several turns. In some implementations, a turn of the toroid inductor 600 includes an inner via (e.g., via 610a), an upper interconnect (e.g., interconnect 604a), a first outer via (e.g., 612a), a second outer via (e.g., via 612b), and a lower interconnect (e.g., the interconnect 602b). The via 610a is coupled to the interconnect 604a. The interconnect 604a is coupled to the via 612a and the via 612b. The via 612a and the via 612b are coupled to the interconnect 602b, which in some implementations, defines a turn (e.g., first turn) of the toroid inductor 600. Portions of the interconnect 604a at least partially vertically overlaps portions of the interconnect 602b.

Another turn (e.g., second turn) of the toroid inductor 600 may be defined by the interconnect 604c, the via 612c, the via 612d, the interconnect 602c, and the via 610c. The interconnect 604c is coupled to the via 612c and the via 612d. The via 612c and the via 612d are coupled to the interconnect 602c. The interconnect 602c is coupled to the via 610c. Portions of the interconnect 604c at least partially vertically overlaps portions of the interconnect 602c.

In the above examples, a turn of the toroid inductor 600 is defined by two outer vias (e.g., via 612a, via 612b). The use of two outer vias (or more) in at least one turn of the toroid inductor 600 creates a built-in enclosure that helps reduce and minimize the electromagnetic field that leaks from the toroid inductor 600, which consequently reduces the electromagnetic interference (EMI) that the toroid inductor 600 may have on nearby electronic circuits (e.g., dies). As a result, the toroid inductor 600 may be positioned closer to electronic circuits (e.g., dies) without the toroid inductor adversely affecting the nearby electronic circuits. The end result of all of this is a much smaller device (e.g., mobile device, wearable device) that includes a toroid inductor and electronic circuits.

Another advantage of the toroid inductor 600 is its overall better quality factor (Q value) and/or inductance value, in comparison to a comparable sized inductor. Exemplary Q values and inductances values for various toroid inductors are further described, below in Table 1.

FIG. 6 illustrates that a turn of the toroid inductor 600 includes one inner via and two outer vias. In some implementations, a turn of the toroid inductor 600 may include more than two outer vias, more than one inner vias, or a combination thereof.

FIG. 7 illustrates a plan view (e.g., top view) of the plurality of first interconnects 602 that define the toroid inductor 600. In some implementations, the plurality of first interconnects 602 may be interconnects (e.g., traces) on a first metal layer of a substrate, an interposer and/or a printed circuit board (PCB).

FIG. 8 illustrates a plan view (e.g., top view) of the plurality of first vias 610 and the plurality of second vias 612 that are formed over the plurality of first interconnects 602. In some implementations, the plurality of first vias 610 and the plurality of second vias 612 may be vias that traverse a substrate, an interposer and/or a printed circuit board (PCB).

FIG. 9 illustrates a plan view (e.g., top view) of the plurality of second interconnects 604 that define the toroid inductor 600. The plurality of second interconnects 604 are formed over the plurality of first vias 610 and the plurality of second vias 612. In some implementations, the plurality of second interconnects 604 may be interconnects (e.g., traces) on a second metal layer of a substrate, an interposer and/or a printed circuit board (PCB).

Exemplary Toroid Inductor with Reduced Electromagnetic Field Leakage

FIG. 10 illustrates an example of a toroid inductor 1000. As will be further described below, the toroid inductor 1000 includes a design and structure that creates a built-in enclosure that helps reduce and minimize the electromagnetic field that leaks from the toroid inductor 1000. In particular, FIG. 10 illustrates a toroid inductor that includes intertwined turns and at least one turn with multiple outer vias (e.g., two or more outer vias), to create a built-in enclosure that helps reduce and minimize electromagnetic field leaks from the toroid inductor.

The toroid inductor 1000 includes a plurality of first interconnects 1002, a plurality of second interconnects 1004, a plurality of first vias 1010, and a plurality of second vias 1012. The toroid inductor 1000 includes a plurality of turns that are defined by the plurality of first interconnects 1002, the plurality of second interconnects 1004, the plurality of first vias 1010, and the plurality of second vias 1012. The toroid inductor 1000 may be an inductive means.

The plurality of first interconnects 1002 includes the interconnects 1002a-1002d. The plurality of first interconnects 1002 may be lower interconnects or bottom interconnects of the toroid inductor 1000. The plurality of first interconnects 1002 may include traces (e.g., lower traces). One or more interconnects from the plurality of first interconnects 1002 may include an L shape or an approximate L shape.

The plurality of second interconnects 1004 includes the interconnects 1004a-1004d. The plurality of second interconnects 1004 may be upper interconnects or top interconnects of the toroid inductor 1000. The plurality of second interconnects 1004 may include traces (e.g., upper traces). One or more interconnects from the plurality of second interconnects 1004 may include an L shape or an approximate L shape.

The plurality of first vias 1010 includes the vias 1010a-1010d. The plurality of first vias 1010 may be vias (e.g., inner vias) that define an inner boundary or inner perimeter of the toroid inductor 1000. The plurality of first vias 1010 is coupled to the plurality of first interconnects 1002 and the plurality of second interconnects 1004. The plurality of second vias 1012 includes the vias 1012a-1012d. The plurality of second vias 1012 may be vias (e.g., outer vias) that define an outer boundary or outer perimeter of the toroid inductor 1000. The plurality of second vias 1012 is coupled to the plurality of first interconnects 1002 and the plurality of second interconnects 1004.

The toroid inductor 1000 includes several turns. In some implementations, a turn of the toroid inductor 1000 includes an inner via (e.g., via 1010a), an upper interconnect (e.g., interconnect 1004a), a first outer via (e.g., via 1012a), a second outer via (e.g., via 1012b), and a lower interconnect (e.g., the interconnect 1002b). The via 1010a is coupled to the interconnect 1004a. The interconnect 1004a is coupled to the via 1012a and the via 1012b. The via 1012a and the via 1012b are coupled to the interconnect 1002b, which in some implementations, defines a turn (e.g., first turn) of the toroid inductor 1000. Portions of the interconnect 1004a at least partially vertically overlaps portions of the interconnect 1002b.

Another turn second turn) of the toroid inductor 1000 may be defined by the interconnect 1004c, the via 1012c, the via 1012d, the interconnect 1002c, and the via 1010c. The interconnect 1004c is coupled to the via 1012c and the via 1012d. The via 1012c and the via 1012d are coupled to the interconnect 1002c. The interconnect 1002c is coupled to the via 1010c. Portions of the interconnect 1004c at least partially vertically overlaps portions of the interconnect 1002c.

As shown in FIG. 10, the toroid inductor 1000 is formed by several turns that are intertwined with each other. For example, a turn first turn) that is defined by the via 1010a, the interconnect 1002a, the via 1012a, the 1012b and the interconnect 1004a, is intertwined with another turn (e.g., second turn) that is defined by the via 1010b, the interconnect 1002b, the via 1012e, the via 1012f, and the interconnect 1004b.

The intertwining of the turns of the toroid inductor 1000 and the use of turns defined by two or more vias (e.g., via 1012a, via 1012b) creates a built-in enclosure that helps reduce and minimize the electromagnetic field that leaks from the toroid inductor 1000, which consequently reduces the electromagnetic interference (EMI) that the toroid inductor 1000 may have on nearby electronic circuits (e.g., dies). As a result, the toroid inductor 1000 may be positioned closer to electronic circuits (e.g., dies) without the toroid inductor adversely affecting the nearby electronic circuits. The end result of all of this is a much smaller device (e.g., mobile device, wearable device) that includes a toroid inductor and electronic circuits.

Another advantage of the toroid inductor 1000 is its overall better quality factor (Q value) and/or inductance value, in comparison to a comparable sized inductor. Exemplary Q values and inductances values for various toroid inductors are further described below in Table 1.

FIG. 10 illustrates that a turn of the toroid inductor 1000 includes one inner via and two outer vias. In some implementations, a turn of the toroid inductor 1000 may include more than two outer vias, more than one inner vias, or a combination thereof.

FIG. 11 illustrates a plan view (e.g., top view) of the plurality of first interconnects 1002 that define the toroid inductor 1000. In some implementations, the plurality of first interconnects 1002 may be interconnects (e.g., traces) on a first metal layer of a substrate, an interposer and/or a printed circuit board (PCB).

FIG. 12 illustrates a plan view (e.g., top view) of the plurality of first vias 1010 and the plurality of second vias 1012 that are formed over the plurality of first interconnects 1002. In some implementations, the plurality of first vias 1010 and the plurality of second vias 1012 may be vias that traverse a substrate, an interposer and/or a printed circuit board (PCB).

FIG. 13 illustrates a plan view (e.g., top view) of the plurality of second interconnects 1004 that define the toroid inductor 1000. The plurality of second interconnects 1004 are formed over the plurality of first vias 1010 and the plurality of second vias 1012. In some implementations, the plurality of second interconnects 1004 may be interconnects (e.g., traces) on a second metal layer of a substrate, an interposer and/or a printed circuit board (PCB).

Exemplary Toroid Inductor with Reduced Electromagnetic Field Leakage

Figure 14:
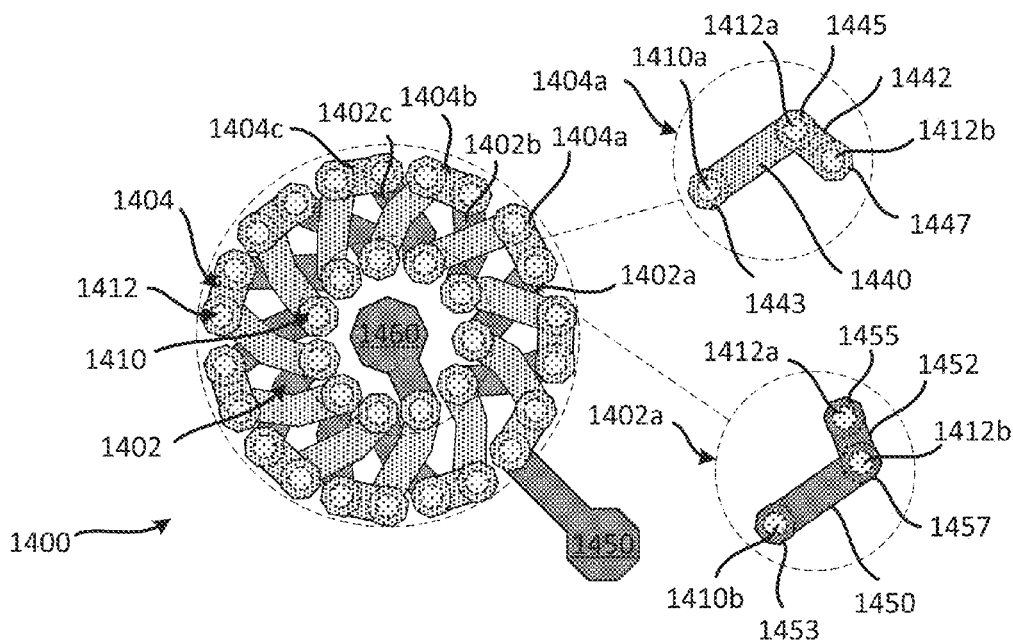
FIG. 14 illustrates a plan view of a toroid inductor comprising intertwined interconnects.

FIG. 14 illustrates an example of a toroid inductor 1400. As will be further described below, the toroid inductor 1400 includes a design and structure that creates a built-in enclosure that helps reduce and minimize the electromagnetic field that leaks from the toroid inductor 1400. In particular, FIG. 14 illustrates a toroid inductor that includes intertwined turns and at least one turn with multiple outer vias, to create a built-in enclosure that helps reduce and minimize electromagnetic field leaks from the tumid inductor.

The toroid inductor 1400 is similar to the toroid inductor 1000, except that the toroid inductor 1400 also includes pads. The toroid inductor 1400 includes a plurality of first interconnects 1402, a plurality of second interconnects 1404, a plurality of first vias 1410, and a plurality of second vias 1412. At least one of plurality of first interconnects 1402 includes a trace and a pad. At least one plurality of second interconnects 1404 includes a trace and a pad. The toroid inductor 1400 may be an inductive means.

The plurality of first interconnects 1402 includes the interconnects 1402a-1402c. The plurality of first interconnects 1402 may be lower interconnects or bottom interconnects of the toroid inductor 1400. The plurality of first interconnects 1402 may include traces (e.g., lower traces) and pads (e.g., lower pads). One or more interconnects from the plurality of first interconnects 1402 may include an L shape or an approximate L shape.

The plurality of second interconnects 1404 includes the interconnects 1404a-1404c. The plurality of second interconnects 1404 may be upper interconnects or top interconnects of the toroid inductor 1400. The plurality of second interconnects 1404 may include traces (e.g., upper traces) and pads (e.g., upper pads). One or more interconnects from the plurality of second interconnects 1404 may include an L shape or an approximate L shape.

The plurality of first vias 1410 includes the vias 1410a-1410b. The plurality of first vias 1410 may be vias (e.g., inner vias) that define an inner boundary or inner perimeter of the toroid inductor 1400. The plurality of first vias 1410 is coupled to the plurality of first interconnects 1402 and the plurality of second interconnects 1404. The plurality of second vias 1412 includes the vias 1412a-1412b. The plurality of second vias 1412 may be vias (e.g., outer vias) that define an outer boundary or outer perimeter of the toroid inductor 1400. The plurality of second vias 1412 is coupled to the plurality of first interconnects 1402 and the plurality of second interconnects 1404.

The toroid inductor 1400 includes several turns. In some implementations, a turn of the toroid inductor 1400 includes an inner via (e.g., via 1410a), an upper interconnect (e.g., interconnect 1404a), a first outer via (e.g., via 1412a), a second outer via (e.g., via 1412b), and a lower interconnect (e.g., the interconnect 1402b). The via 1410a is coupled to the interconnect 1404a. The interconnect 1404a is coupled to the via 1412a and the via 1412b. The via 1412a and the via 1412b are coupled to the interconnect 1402b, which in some implementations, defines a turn (e.g., first turn) of the toroid inductor 1400. Portions of the interconnect 1404a at least partially vertically overlaps portions of the interconnect 1402b.

As shown in FIG. 14, the toroid inductor 1400 is formed by several turns that are intertwined with each other. The intertwining of the turns of the toroid inductor 1400 and the use of turns defined by two or more vias (e.g., via 1412a, via 1412b) creates a built-in enclosure that helps reduce and minimize the electromagnetic field that leaks from the toroid inductor 1400, which consequently reduces the electromagnetic interference (EMI) that the toroid inductor 1400 may have on nearby electronic circuits (e.g., dies). Another advantage of the toroid inductor 1400 is its overall better quality factor (Q value) and/or inductance value, in comparison to a comparable sized inductor. Exemplary Q values and inductances values for various toroid inductors are further described below in Table 1.

FIG. 14 illustrates that a turn of the toroid inductor 1400 includes one inner via and two outer vias. In some implementations, a turn of the toroid inductor 1400 may include more than two outer vias, more than one inner vias, or a combination thereof.

Figure 15:
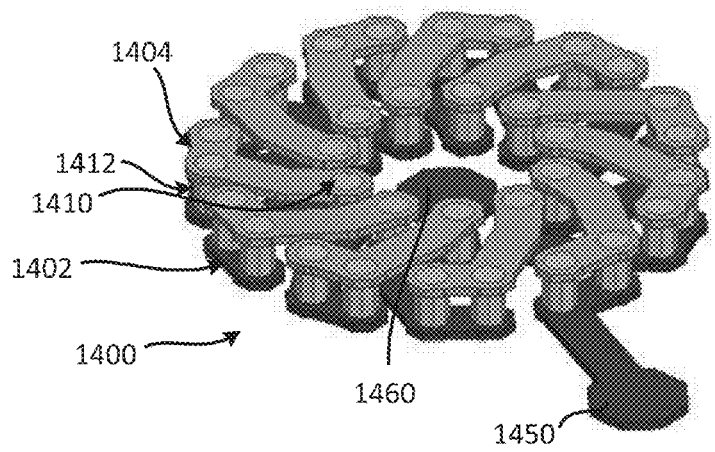
FIG. 15 illustrates an angled view of a toroid inductor comprising intertwined interconnects.

FIG. 15 illustrates an angled view of the toroid inductor 1400 includes a plurality of first interconnects 1402, a plurality of second interconnects 1404, a plurality of first vias 1410, and a plurality of second vias 1412.

FIGS. 2-15 illustrate toroid inductors with circular ring shape. In some implementations, toroid inductors may include different ring shapes. These different ring shapes are further described below.

As mentioned above, the use of intertwined turns and multiple outer vias turns with a toroid inductor provides a toroid inductor with a better inductance (L) and better quality factor (Q), resulting in a better performing inductor. Generally speaking, the higher the inductance value and/or the quality factor value the better.

Table 1 below, illustrates some exemplary inductance (L) values and quality factor (Q) values for exemplary toroid inductors with various configurations and/or designs.

TABLE 1

Exemplary Inductance (L) Values and Quality Factor (Q) Values

Figure 1:
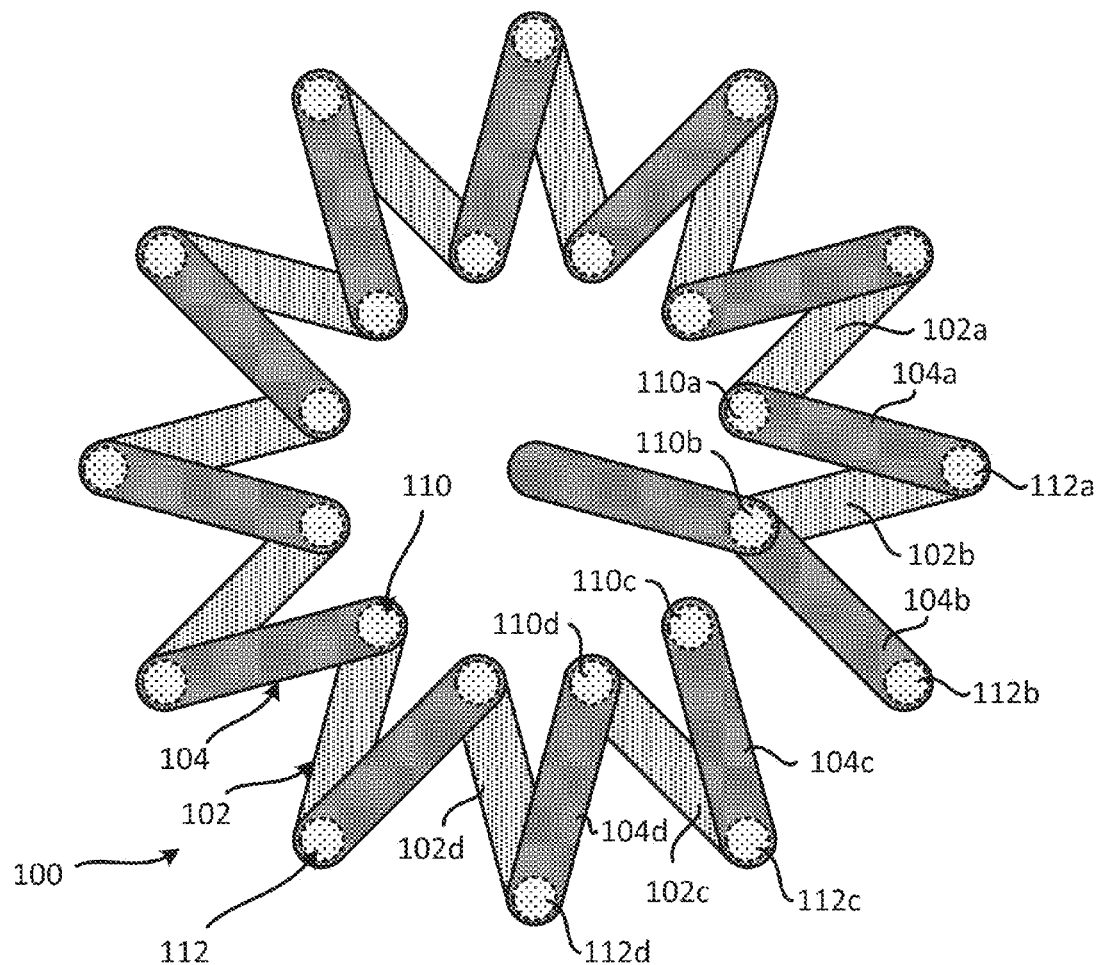
FIG. 1 illustrates a plan view of a toroid inductor.

|  | Toroid Inductor of FIG. 1 | Toroid Inductor with Intertwined Turns (e.g., FIG. 2) | Toroid Inductor with Intertwined Turns and Multiple Outer Vias a Turns (e.g., FIG. 10) |
|---|---|---|---|
| Inductance (L) (nH) | 2.85 | 4.76 | 4.95 |
| Quality Factor (Q) at 200 megahertz (MHz) | 15.3 | 17.8 | 19.4 |

As shown in Table 1, the use of intertwined turns and multiple outer vias in turns improves the inductance and the quality factor of a toroid inductor. It is noted that Table 1 is merely an example of possible inductance (L) values and/or the quality factor (Q) values for comparably sized toroid inductors. Different sizes, shapes and designs of a toroid inductor may provide different inductance (L) values and/or quality factor (Q) values.

Exemplary Coupled Toroid Inductor with Reduced Electromagnetic Field Leakage

Figure 16:
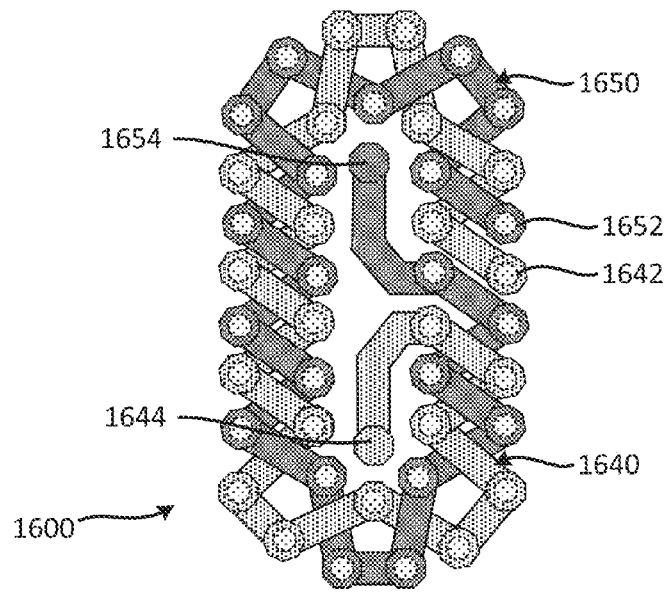
FIG. 16 illustrates a plan view of a toroid inductor comprising intertwined interconnects.
Figure 17:
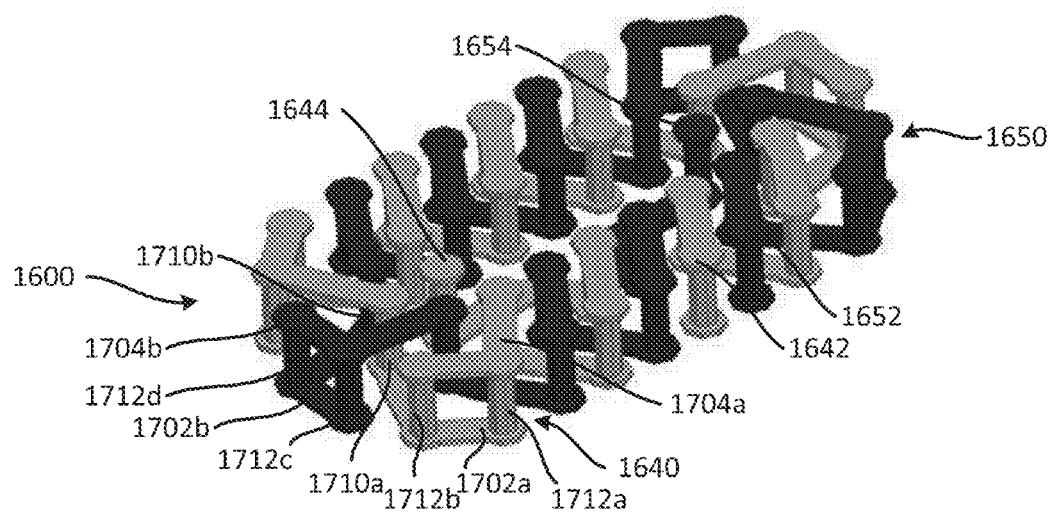
FIG. 17 illustrates an angled view of a toroid inductor comprising intertwined interconnects.

FIGS. 16 and 17 illustrate an example of a coupled toroid inductor 1600. As will be further described below, the coupled toroid inductor 1600 includes a design and structure that creates a built-in enclosure that helps reduce and minimize the electromagnetic field that leaks from the coupled toroid inductor 1600. In particular, FIGS. 16 and 17 illustrate a coupled toroid inductor that includes intertwined turns and at least one turn with multiple outer vias (e.g., two or more outer vias), to create a built-in enclosure that helps reduce and minimize electromagnetic field leaks from the toroid inductor. In some implementations, the coupled toroid inductor 1600 includes a transformer. The coupled toroid inductor 1600 may be implemented in an integrated device, an integrated circuit (IC) module, an integrated circuit (IC) package, a die, a substrate, an interposer and/or a printed circuit board (PCB).

The coupled toroid inductor 1600 includes a first toroid inductor 1640 and a second toroid inductor 1650. The first toroid inductor 1640 includes a first terminal 1642 and a second terminal 1644. The second toroid inductor 1650 includes a first terminal 1652 and a second terminal 1654. The first toroid inductor 1640 is intertwined with the second toroid inductor 1650. That is, at least some of the interconnects of the first toroid inductor 1640 is intertwined with at least some of the interconnects of the second toroid inductor 1650. The coupled toroid inductor 1600 includes an oval shape or an approximate rectangular shape. However, different implementations of the coupled toroid inductor 1600 may include different shapes.

The first toroid inductor 1640 includes a plurality of first interconnects (e.g., interconnect 1702*a*), a plurality of second interconnects (e.g., interconnect 1704*a*), a plurality of first vias (e.g., via 1710*a*), and a plurality of second vias (e.g., via 1712*a*, 1712*b*). The interconnect 1702*a* may include a trace and a pad. The interconnect 1704*a* may include a trace and a pad. The first toroid inductor 1640 may be an inductive means.

The second toroid inductor 1650 includes a plurality of first interconnects (e.g., interconnect 1702*b*), a plurality of second interconnects (e.g., interconnect 1704*b*), a plurality of first vias (e.g., via 1710*b*), and a plurality of second vias (e.g., via 1712*c*, 1712*c*). The interconnect 1702*b* may include a trace and a pad. The interconnect 1704*b* may include a trace and a pad. The first toroid inductor 1640 may be an inductive means.

The interconnect 1702*a* and the interconnect 1702*b* may be lower interconnects or bottom interconnects of the coupled toroid inductor 1600. The interconnect 1702*a* and the interconnect 1702*b* may be similar in shape and/or design as the interconnect 1402*a* of FIG. 14.

The interconnect 1704*a* and the interconnect 1704*b* may be upper interconnects or top interconnects of the coupled toroid inductor 1600. The interconnect 1704*a* and the interconnect 1704*b* may be similar in shape and/or design as the interconnect 1404*a* of FIG. 14.

The first toroid inductor 1640 includes several turns in some implementations, a turn of the first toroid inductor 1640 includes an inner via (e.g., via 1710*a*), an upper interconnect (e.g., interconnect 1704*a*), a first outer via (e.g., via 1712*a*), a second outer via (e.g., via 1712*b*), and a lower interconnect (e.g., the interconnect 1702*a*). The via 1710*a* is coupled to the interconnect 1702*a*. The interconnect 1702*a* is coupled to the via 1712*a* and the via 1712*b*. The via 1712*a* and the via 1712*b* are coupled to the interconnect 1704*a*. Portions of the interconnect 1704*a* at least partially vertically overlaps portions of the interconnect 1702*a*.

The second toroid inductor 1650 includes several turns. In some implementations, a turn of the second toroid inductor 1650 includes an inner via (e.g., via 1710*b*), an upper interconnect (e.g., interconnect 1704*b*), a first outer via (e.g., via 1712*c*), a second outer via (e.g., via 1712*d*), and a lower interconnect (e.g., the interconnect 1702*b*). The via 1710*b* is coupled to the interconnect 1702*b*. The interconnect 1702*b* is coupled to the via 1712*c* and the via 1712*d*. The via 1712*c* and the via 1712*d* are coupled to the interconnect 1704*b*. Portions of the interconnect 1704*b* at least partially vertically overlaps portions of the interconnect 1702*b*.

FIGS. 16 and 17 illustrate that some of the turns of the coupled toroid inductor 1600 includes one inner via and two outer vias. In some implementations, a turn of the coupled toroid inductor 1600 may include more than two outer vias, more than one inner via's, or a combination thereof.

Exemplary Coupled Tumid Inductor with Reduced Electromagnetic Field Leakage

Figure 18:
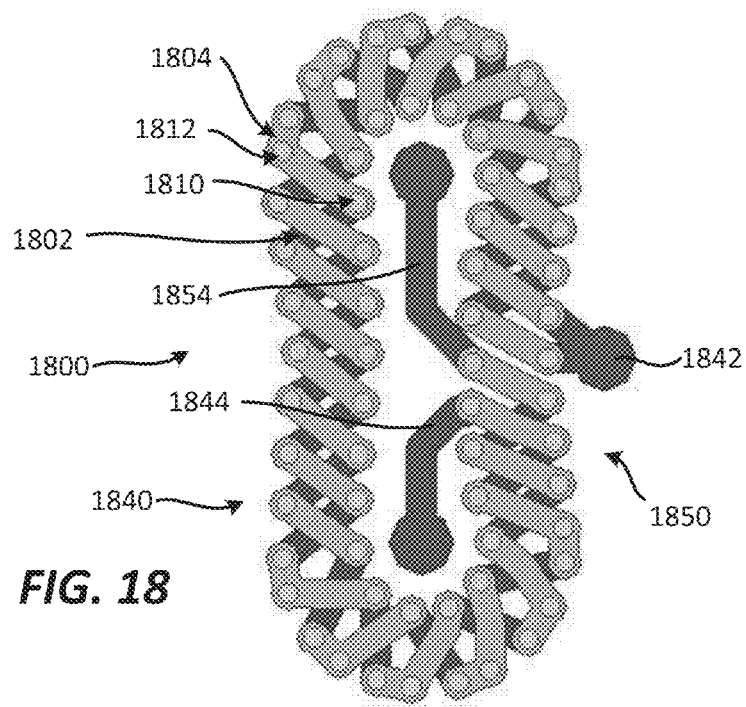
FIG. 18 illustrates a plan view of a toroid inductor comprising intertwined interconnects.
Figure 19:
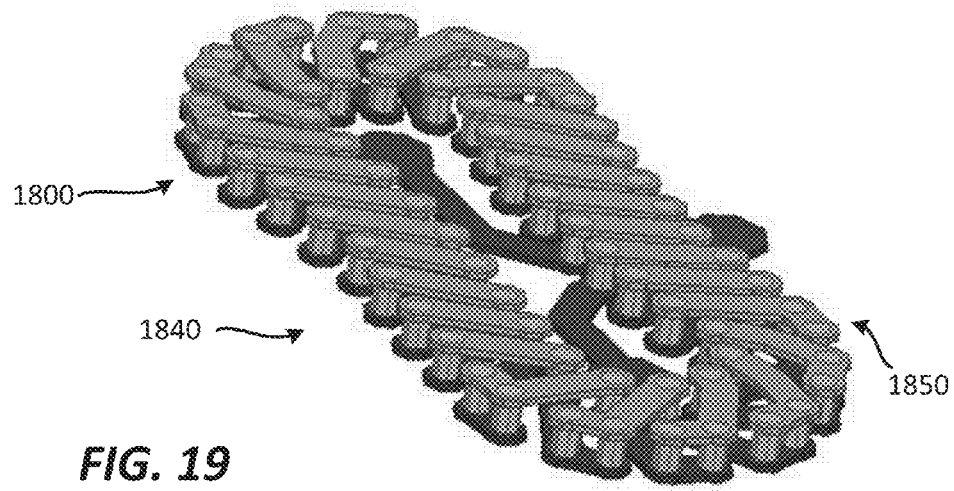
FIG. 19 illustrates an angled view of a toroid inductor comprising intertwined interconnects.

FIGS. 18 and 19 illustrate an example of a coupled toroid inductor 1800. As will be further described below, the coupled toroid inductor 1800 includes a design and structure that creates a built-in enclosure that helps reduce and minimize the electromagnetic field that leaks from the coupled toroid inductor 1800. In particular, FIGS. 18 and 19 illustrate a coupled toroid inductor that includes intertwined turns and at least one turn with multiple outer vias, to create a built-in enclosure that helps reduce and minimize electromagnetic field leaks from the toroid inductor.

The coupled toroid inductor 1800 may be similar to the coupled toroid inductor 1600, except that the coupled toroid inductor 1800 has 3 terminals, instead of the 4 terminals of the coupled toroid inductor 1600.

The coupled toroid inductor 1800 includes a first toroid inductor 1840 and a second toroid inductor 1850. The first toroid inductor 1840 includes a first terminal 1842 and a second terminal 1844. The second toroid inductor 1850 includes the first terminal 1842 and a second terminal 1854. The first toroid inductor 1840 is intertwined with the second toroid inductor 1850. That is, at least some of the interconnects of the first toroid inductor 1840 is intertwined with at least some of the interconnects of the second toroid inductor 1850. The coupled toroid inductor 1800 includes an oval shape or an approximate rectangular shape. However, different implementations of the coupled toroid inductor 1800 may include different shapes.

The coupled toroid inductor 1800 includes a plurality of first interconnects 1802, a plurality of second interconnects 1804, a plurality of first vias 1810 (e.g., inner vias), and a plurality of second vias 1812 (e.g., outer vias). The plurality of first interconnects 1802 may include a trace and a pad. The plurality of second interconnects 1804 may include a trace and a pad. A turn of the coupled toroid inductor 1800 may include a via from the plurality of first vias 1810, coupled to an interconnect from the plurality of first interconnects 1802, which is coupled to vias from the plurality of second vias 1812, which are coupled to an interconnect from the plurality of second interconnects 1804. The coupled toroid inductor 1800 may be an inductive means.

An interconnect from the plurality of first interconnects 1802 may be similar in shape and/or design as the interconnect 1402*a* of FIG. 14. An interconnect from the plurality of second interconnects 1804 may be similar in shape and/or design as the interconnect 1404*a* of FIG. 14.

FIGS. 18 and 19 illustrate that some of the turns of the coupled toroid inductor 1800 includes one inner via and two outer vias. In some implementations, a turn of the coupled toroid inductor 1800 may include more than two outer vias, more than one inner vias, or a combination thereof.

Figure 20:
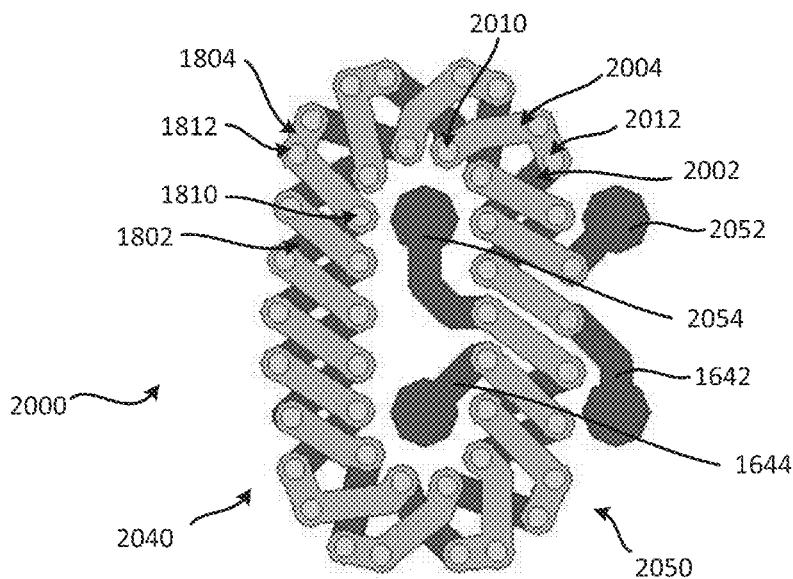
FIG. 20 illustrates a plan view of a toroid inductor comprising intertwined interconnects.

FIG. 20 illustrates another example of a coupled toroid inductor 2000. The coupled toroid inductor 2000 includes a design and structure that creates a built-in enclosure that helps reduce and minimize the electromagnetic field that leaks from the coupled toroid inductor 2000. FIG. 20 illustrate a coupled toroid inductor that includes intertwined tunas and at least one turn with multiple outer vias, to create a built-in enclosure that helps reduce and minimize electromagnetic field leaks from the toroid inductor.

The coupled toroid inductor 2000 may be similar to the coupled toroid inductor 1600. The coupled toroid inductor 2000 may be similar to the coupled toroid inductor 1800, except that the coupled toroid inductor 2000 has 4 terminals, instead of the 3 terminals of the coupled toroid inductor 1800.

The coupled toroid inductor 2000 includes a first toroid inductor 2040 and a second toroid inductor 2050. The first toroid inductor 2040 includes a first terminal 2042 and a second terminal 2044. The second toroid inductor 2050 includes a first terminal 2052 and a second terminal 2054. The first toroid inductor 2040 is intertwined with the second toroid inductor 2050. That is, at least some of the interconnects of the first toroid inductor 2040 is intertwined with at least some of the interconnects of the second toroid inductor 2050. The coupled toroid inductor 2000 includes an oval shape or an approximate rectangular shape. However, different implementations of the coupled toroid inductor 2000 may include different shapes.

The first toroid inductor 2040 includes a plurality of first interconnects 1802, a plurality of second interconnects 1804, a plurality of first vias 1810 (e.g., inner vias), and a plurality of second vias 1812 (e.g., outer vias). The plurality of first interconnects 1802 may include a trace and a pad. The plurality of second interconnects 1804 may include a trace and a pad. A turn of the coupled toroid inductor 1800 may include a via from the plurality of first vias 1810, coupled to an interconnect from the plurality of first interconnects 1802, which is coupled to vias from the plurality of second vias 1812, which are coupled to an interconnect from the plurality of second interconnects 1804. The coupled toroid inductor 2000 may be an inductive means.

The second toroid inductor 2050 includes a plurality of first interconnects 2002, a plurality of second interconnects 2004, a plurality of first vias 2010 (e.g., inner vias), and a plurality of second vias 2012 (e.g., outer vias). The plurality of first interconnects 2002 may include a trace and a pad. The plurality of second interconnects 2004 may include a trace and a pad. A turn of the coupled toroid inductor 2000 may include a via from the plurality of first vias 2010, coupled to an interconnect from the plurality of first interconnects 2002, which is coupled to vias from the plurality of second vias 2012, which are coupled to an interconnect from the plurality of second interconnects 2004.

An interconnect from the plurality of first interconnects 1802 and/or from the plurality of first interconnects 2002 may be similar in shape and/or design as the interconnect 1402*a* of FIG. 14. An interconnect from the plurality of second interconnects 1804 and/or from the plurality of second interconnects 2004 may be similar in shape and/or design as the interconnect 1404*a* of FIG. 14.

FIG. 20 illustrate that some of the turns of the coupled toroid inductor 2000 includes one inner via and two outer vias. In some implementations, a turn of the coupled toroid inductor 2000 may include more than two outer vias, more than one inner vias, or a combination thereof.

Figure 21:
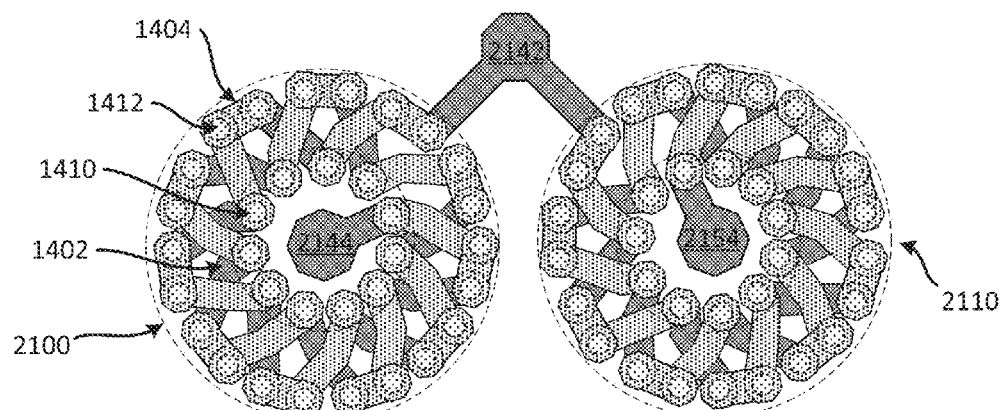
FIG. 21 illustrates a plan view of a toroid inductor comprising intertwined interconnects.

FIG. 21 illustrates an example of a coupled toroid inductor 2100. The coupled toroid inductor 1800 includes a design and structure that creates a built-in enclosure that helps reduce and minimize the electromagnetic field that leaks from the coupled toroid inductor 2100.

The coupled toroid inductor 2100 includes a first toroid inductor 2140 and a second toroid inductor 2150. The first toroid inductor 2140 includes a first terminal 2142 and a second terminal 2144. The second toroid inductor 2150 includes the first terminal 2142 and a second terminal 2154.

The first toroid inductor 2140 may be similar in design and shape as the toroid inductor 1400. For example, the first toroid inductor 2140 may include a plurality of first interconnects 1802, a plurality of second interconnects 1804, a plurality of first vias 1810 (e.g., inner vias), and a plurality of second vias 1812 outer vias). The plurality of first interconnects 1802 may include a trace and a pad. The plurality of second interconnects 1804 may include a trace and a pad. Similarly, the second toroid inductor 2150 may be similar in design and shape as the toroid inductor 1400.

It is noted that any of the toroid inductors (e.g., toroid inductor 1000) and/or coupled toroid inductors (e.g., coupled toroid inductor 1800) may be implemented in an integrated device, an integrated circuit (IC) module, an integrated circuit (IC) package, a die, a substrate, an interposer and/or a printed circuit board (PCB). Having described various toroid inductors, a sequence and method for fabricating such toroid inductors in an integrated device will now be described below.

Figure 22:
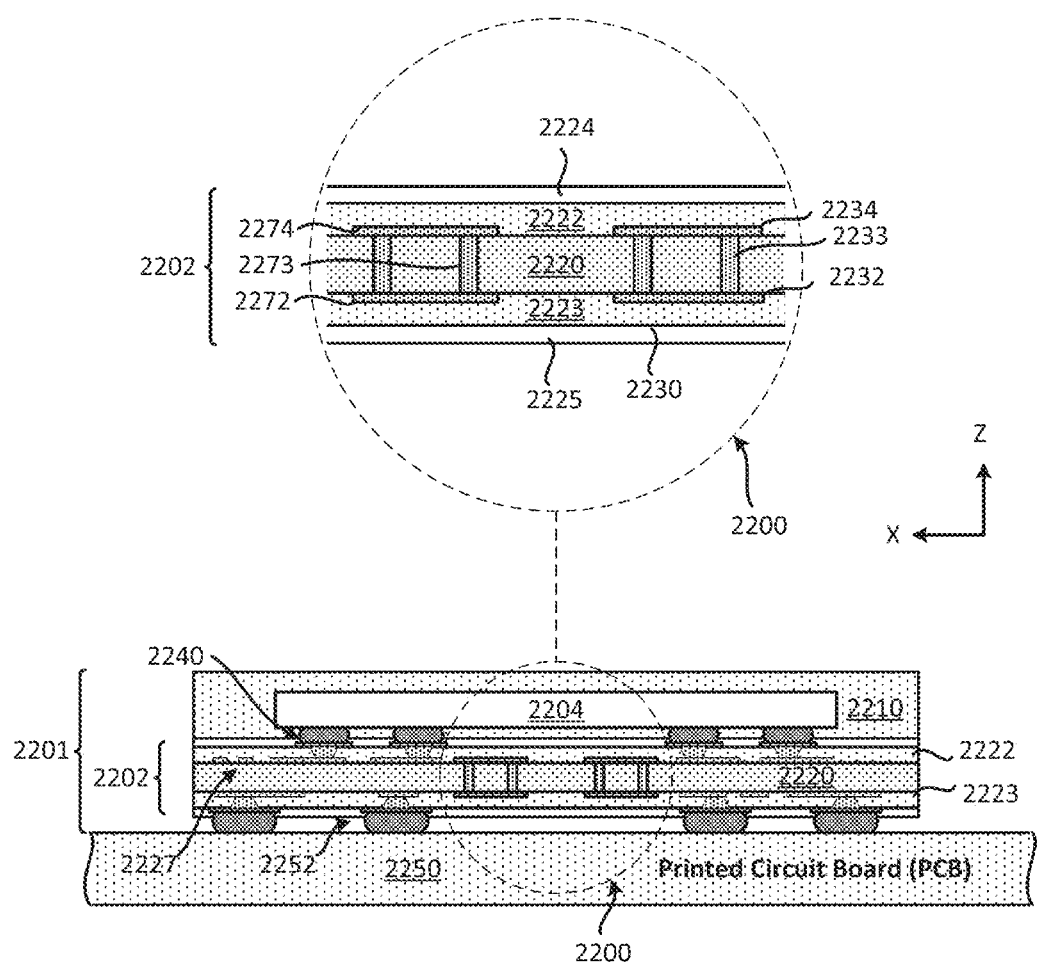
FIG. 22 illustrates a profile view of an example of an integrated circuit (IC) package that includes a toroid inductor embedded in a package substrate.

Exemplary Integrated Circuit Package Comprising a Toroid Inductor in a Package Substrate FIG. 22 illustrates an example of an integrated circuit (IC) package that includes a toroid inductor embedded in a package substrate. Specifically, FIG. 22 illustrates an example of an integrated circuit package 2201 that includes a substrate 2202, a die 2204, a toroid inductor 2200 and an encapsulation layer 2210. The integrated circuit package 2201 is mounted on a printed circuit board (PCB) 2250. The die 2204 may be an integrated circuit (IC) that includes several transistors and/or other electronic components. The die 2204 may be a logic die and/or a memory die. The toroid inductor 2200 may be any of the toroid inductors (e.g., toroid inductor 1000, coupled toroid inductor 1600) described in the present disclosure.

The substrate 2202 may be a package substrate and/or an interposer of an integrated device. The die 2204 is coupled (e.g., mounted) to the substrate 2202. More specifically, the die 2204 is coupled to the substrate 2202 through a first plurality of solder balls 2240. In some implementations, the die 2204 may be coupled to the substrate 2202 differently.

The substrate 2202 includes a first dielectric layer 2220, a second dielectric layer 2222, a third dielectric layer 2223, a first solder resist layer 2224, a second solder resist layer 2225, and the interconnects 2227. The first dielectric layer 2220 may be a substrate core layer. In some implementations, the first dielectric layer 2220 may be a prepeg layer. The second dielectric layer 2222 and the third dielectric layer 2223 may be one or more dielectric layers (e.g., one or more prepeg layers). The interconnects 2227 may include traces, pads and/or vias, that are formed in the first dielectric layer 2220, the second dielectric layer 2222 and/or the third dielectric layer 2223. The first solder resist layer 2224 is formed on a first surface (e.g., bottom surface, surface facing the PCB 2250, on the third dielectric layer 2223) of the substrate 2202. The second solder resist layer 2225 is formed on a second surface (e.g., top surface, surface facing the die 2204, on the second dielectric layer 2222) of the substrate 2202.

The toroid inductor 2200 is at least partially embedded in the substrate 2202. The toroid inductor 2200 may be defined by interconnects in and/or on the substrate 2202. In some implementations, the substrate 2202 may include more than one inductor. As shown in FIG. 22, the toroid inductor 2200 includes a plurality of first interconnects. More specifically, the toroid inductor 2200 includes an interconnect 2232, an interconnect 2233, an interconnect 2234, an interconnect 2272, an interconnect 2273, and an interconnect 2274.

An interconnect is an element or component of a device (e.g., integrated device, integrated circuit (IC) package, die) and/or a base (e.g., package substrate, printed circuit board, interposer) that allows or facilitates an electrical connection between two points, elements and/or components. In some implementations, an interconnect may include a trace, a via, a pad, a pillar, a redistribution metal layer, and/or an under bump metallization (UBM) layer. In some implementations, an interconnect is an electrically conductive material that is capable of providing an electrical path for a signal (e.g., data signal, ground signal, power signal). An interconnect may include more than one element r component.

The interconnects 2233 and 2273 may include vias. The interconnects 2232, 2234, 2272, and 2274 may include traces and/or pads. In some implementations, the interconnects 2232-2234 and 2272-2274 may define one or more turns of the toroid inductor 2200.

The encapsulation layer 2210 at least partially encapsulates the die 2204. The encapsulation layer 2210 may include a mold and/or an epoxy fill. In some implementations, the encapsulation layer 2210 may be a litho-patternable layer. A litho-patternable layer/material that is a material that is photo etchable. That is, the litho-patternable layer/material is made of a material that can be etched and/or removed (e.g., through a lithography process) through the exposure of the material to a light source (e.g., ultraviolet (UV) light) through a mask (e.g., photomask).

As mentioned above, FIG. 22 further illustrates that the integrated circuit package 2201 is coupled (e.g., mounted) on the printed circuit board (PCB) 2250 through a second plurality of solder balls 2252. More specifically, the substrate 2202 of the integrated circuit package 2201 is coupled to the PCB 2250 through the second plurality of solder balls 2252. In some implementations, the integrated circuit package 2201 may be coupled to the PCB 2250 differently.

FIG. 22 illustrates the toroid inductor 2200 formed on two metal layers of a package substrate. In some implementations, a toroid inductor may be formed on more than two metal layers of a package substrate.

Figure 23:
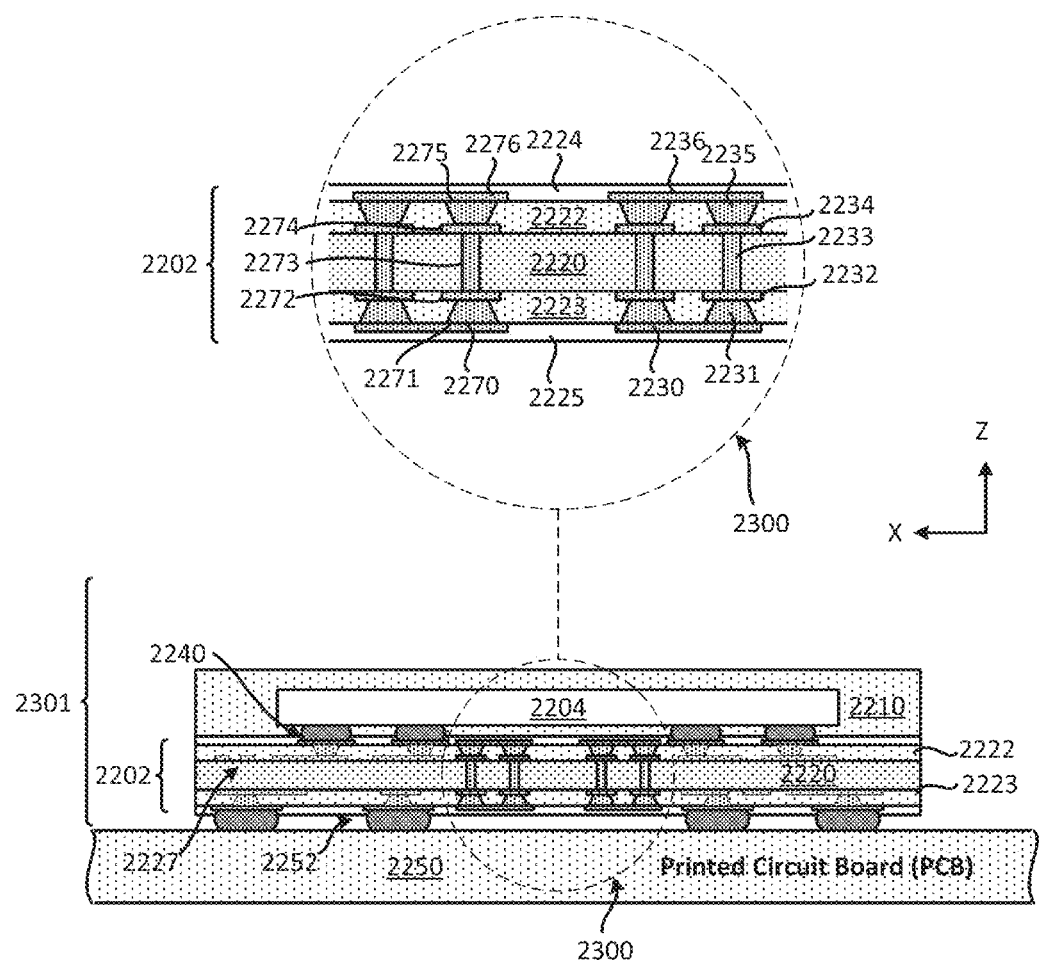
FIG. 23 illustrates a profile view of an example of an integrated circuit (IC) package that includes a toroid inductor embedded in a package substrate.

FIG. 23 illustrates an example of an integrated circuit package 2301 that includes the substrate 2202, the die 2204, a toroid inductor 2300 and the encapsulation layer 2210. The integrated circuit package 2301 is mounted on the printed circuit board (PCB) 2250.

The integrated circuit package 2301 is similar to the integrated circuit package 2201, except that the toroid inductor 2300 is formed on more than two metal layers of the substrate 2202. The toroid inductor 2300 may be any of the toroid inductors described in the present disclosure.

As shown in FIG. 23, the toroid inductor 2300 is at least partially embedded in the substrate 2202. The toroid inductor 2300 may be defined by interconnects in and/or on the substrate 2202. In some implementations, the substrate 2202 may include more than one inductor. As shown in FIG. 23, the toroid inductor 2300 includes interconnects 2230-2236 and interconnects 2270-7776.

The interconnects 2230, 2236, 2270 and 2276 may include traces and/or pads. The interconnects 2231, 2233, 2235, 2271, 2273, and 2275 may include vias. The interconnects 2232, 2234, 2272, and 2274 may include pads. In some implementations, the interconnects 2230-2236 and 2270-2276 may define one or more turns of the toroid inductor 2300.

Figure 24A:
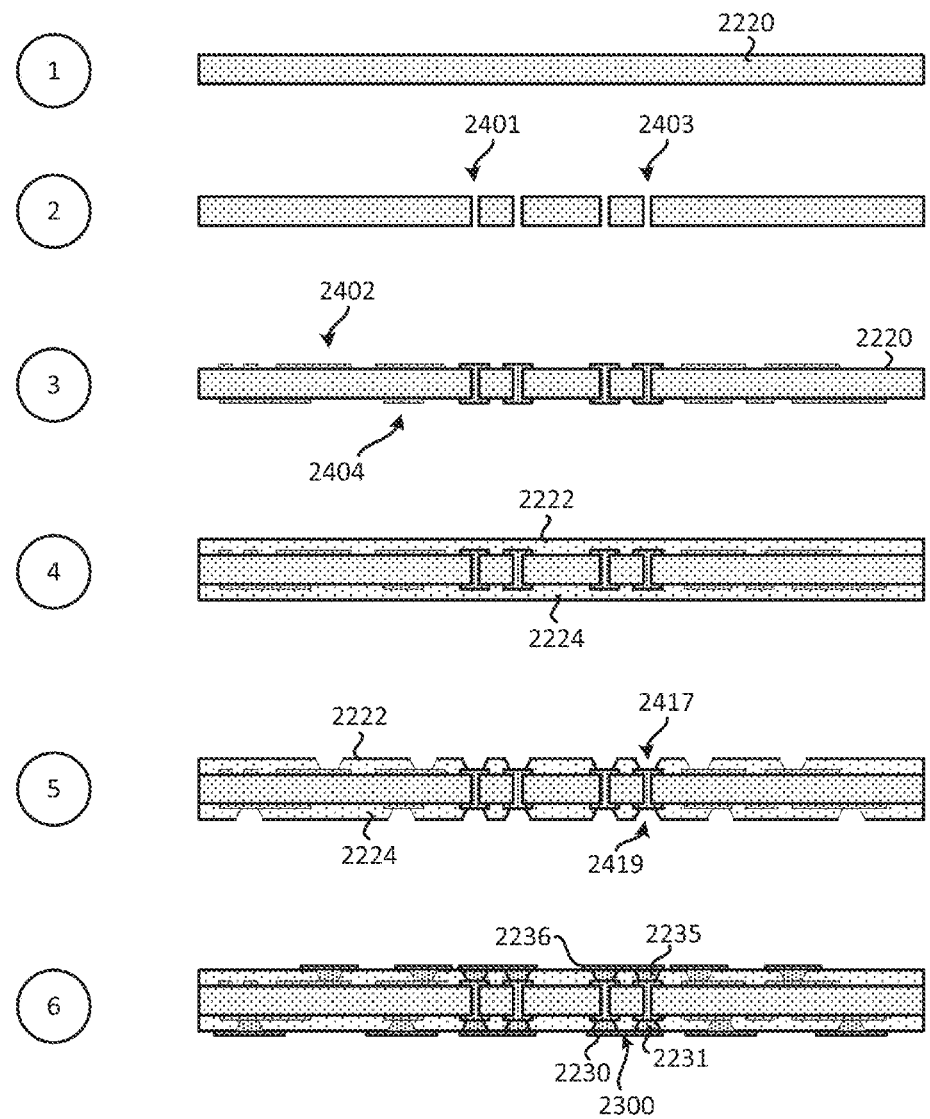
FIG. 24 (which includes FIGS. 24A-24B) illustrates an exemplary sequence for providing/fabricating an integrated circuit (IC) package that includes a toroid inductor embedded in a package substrate.
Figure 24B:
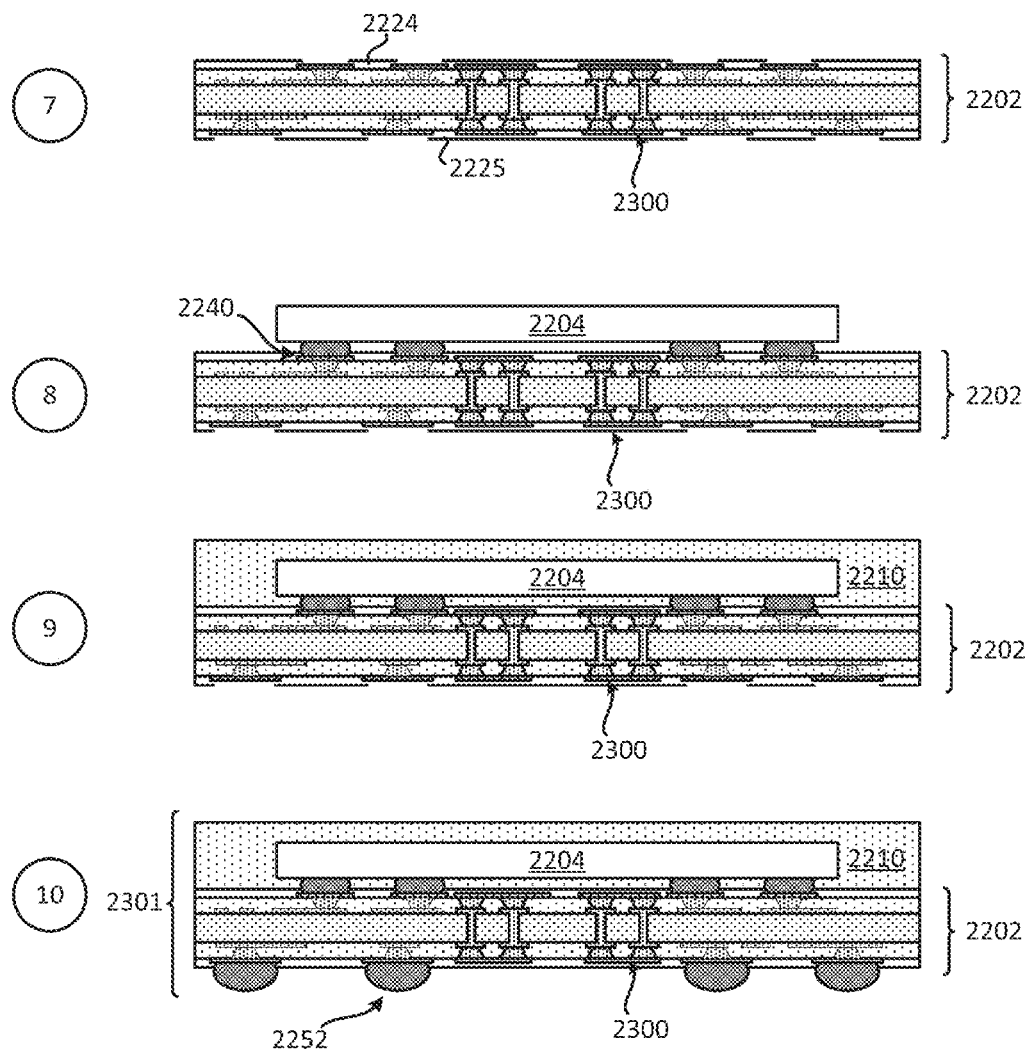

Exemplary Sequence for Providing/Fabricating an Integrated Circuit Package Comprising a Toroid Inductor Embedded in a Package Substrate In some implementations, providing/fabricating an integrated circuit package that includes a toroid inductor embedded in a package substrate includes several processes, FIG. 24 (which includes FIGS. 24A-24B) illustrates an exemplary sequence for providing/fabricating an integrated circuit package that includes a toroid inductor embedded in a package substrate. In some implementations, the sequence of FIGS. 24A-24B may be used to provide/fabricate the integrated circuit package 2301 of FIG. 23 and/or other integrated circuit packages described in the present disclosure.

It should be noted that the sequence of FIGS. 24A-24B may combine one or more stages in order to simplify and/or clarify the sequence for providing/fabricating an integrated circuit package that includes a toroid inductor. In some implementations, the order of the processes may be changed or modified.

Stage 1, as shown in FIG. 24A, illustrates a state after a dielectric layer 2220 is provided. The dielectric layer 2220 may be a substrate core layer. In some implementations, the dielectric layer 2220 may be a glass material. In some implementations, the dielectric layer 2220 is provided by a supplier. In some implementations, the dielectric layer 2220 is fabricated (e.g., formed).

Stage 2 illustrates a state after a first cavity 2401 and a second cavity 2403 are formed in the dielectric layer 2220. Different implementations may form the first cavity 2401 and the second cavity 2403 differently. In some implementations, a laser process may be used to form the cavities.

Stage 3 illustrates a state after a first metal layer 2402 and a second metal layer 2404 are formed on the dielectric layer 2220. The forming and patterning of the first metal layer 2402 and the second metal layer 2404 may form interconnects that define portions (e.g., turns) of a toroid inductor. Different implementations may use different processes for forming the first metal layer 2402 and the second metal layer 2404. A photo-lithography process (e.g., photo-etching process) may be use to pattern the metal layers. Patterning methods could include modified semi-additive or semi-additive patterning processes (SAP).

Stage 4 illustrates a state after a second dielectric layer 2222 is formed on a first surface of the dielectric layer 2220, after a third dielectric layer 2223 is formed on a second side of the dielectric layer 2220.

Stage 5 illustrates a state after a cavity 2417 is formed in the second dielectric layer 2222, and a cavity 2419 is formed in the third dielectric layer 2223. A photo-etching process may be used to form the cavity. Stage 5 involves via cavity formation and patterning for the second and third dielectric layers. Patterning methods could include modified semi-additive or semi-additive patterning processes (SAP).

Stage 6 illustrates a state after an interconnect 2235 (e.g., via) and an interconnect 2236 (e.g., trace) are formed in/on the second dielectric layer 2222, and an interconnect 2231 (e.g., via) and an interconnect 2230 (e.g., trace) are formed in/on the third dielectric layer 2223. The interconnects 2230, 2231, 2235 and 2236 may define a portion (e.g., turn) of a toroid inductor 2300.

Stage 7, as shown in FIG. 24B, illustrates a state after a first solder resist layer 2224 is formed on the second dielectric layer 2222, and a second solder resist layer 2225 is formed on the third dielectric layer 2223. Stage 7 illustrates a substrate 2202 that includes the dielectric layer 2220, the second dielectric layer 2222, the third dielectric layer 2223, several interconnects (e.g., interconnect 2233), the first solder resist layer 2224, and the second solder resist layer 2225. The substrate 2202 may be a package substrate.

Stage 8 illustrates a state after a die 2204 is coupled (e.g., mounted) to the substrate 2202 through a plurality of solder balls 2240. The die 2204 may be coupled to the substrate 2202 differently.

Stage 9 illustrates a state after an encapsulation layer 2210 is formed on the substrate 2202 and the die 2204. In some implementations, the encapsulation layer 2210 comprises a mold and/or epoxy fill. In some implementations, the encapsulation layer 2210 is optional.

Stage 10 illustrates a state after a plurality of solder balls 2252 is coupled to the substrate 2202. In some implementations, stage 10 illustrates an integrated circuit package 2301 that includes the substrate 2202, the toroid inductor 2300 (e.g., defined by interconnects 2230, 2231, 2235 and 2236), the die 2204, and the encapsulation layer 2210.

Figure 25:
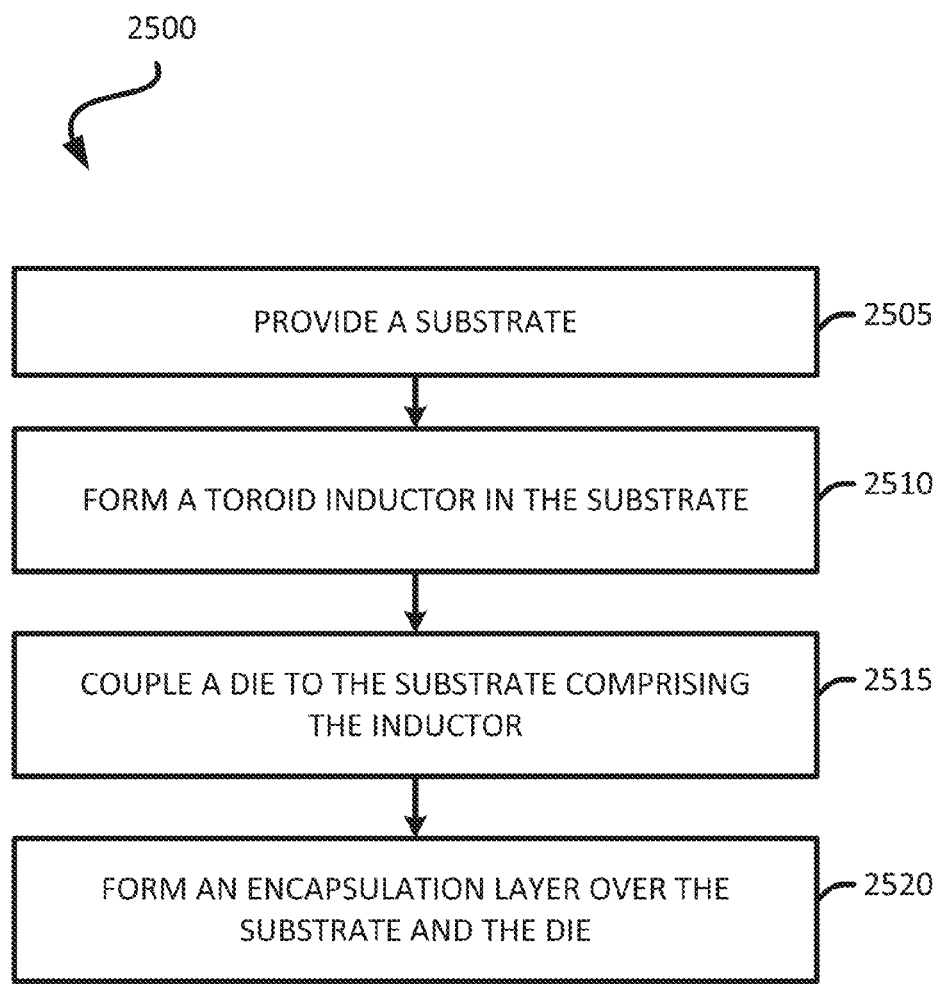
FIG. 25 illustrates an exemplary flow diagram of a method for providing fabricating an integrated circuit (IC) package that includes a toroid inductor embedded in a package substrate.

Exemplary Method for Providing/Fabricating an Integrated Circuit Package Comprising a Toroid Inductor Embedded in a Package Substrate FIG. 25 illustrates an exemplary flow diagram of a method 2500 for providing/fabricating an integrated circuit package that includes a toroid inductor embedded in a package substrate. In some implementations, the method of FIG. 25 may be used to provide/fabricate the integrated circuit package of FIGS. 22, 23 and/or other integrated circuit packages in the present disclosure.

It should be noted that the flow diagram of FIG. 25 may combine one or more steps and/or processes in order to simplify and/or clarify the method for providing an integrated circuit package comprising a toroid inductor. In some implementations, the order of the processes may be changed or modified.

The method provides (at 2505) a substrate. In some implementations, the substrate is provided by a supplier. In some implementations, the substrate is fabricated (e.g., formed). The substrate may be a package substrate. The substrate may be a glass material. The substrate may include a dielectric layer (e.g., substrate core layer) and metal layers on the dielectric layer (e.g., dielectric layer 2220).

The method forms (at 2510) an toroid inductor (e.g., toroid inductor 1000, coupled toroid inductor 1600) in the substrate. Different implementations may provide a toroid inductor with different designs and structures. Any of the toroid inductor described in the present disclosure may be formed in the substrate.

The method couples (at 2515) a die (e.g., die 2204) to the substrate. The die may be coupled to the substrate through a plurality of solder balls (e.g., solder balls 2240). Some implementations may couple the die to the substrate differently. Stage 8 of FIG. 24B illustrates an example of a die coupled to a substrate.

The method forms (at 2520) an encapsulation layer (e.g., encapsulation layer 2210) on the substrate and the die. The encapsulation layer may be a mold and/or an epoxy fill. Stage 9 of FIG. 24B illustrates an example of an encapsulation layer being formed over the substrate and the die. Once the encapsulation is formed, the method may couple a plurality of solder balls to the substrate. The plurality of solder balls may be used to couple the substrate to a printed circuit board (PCB).

Exemplary Electronic Devices

Figure 26:
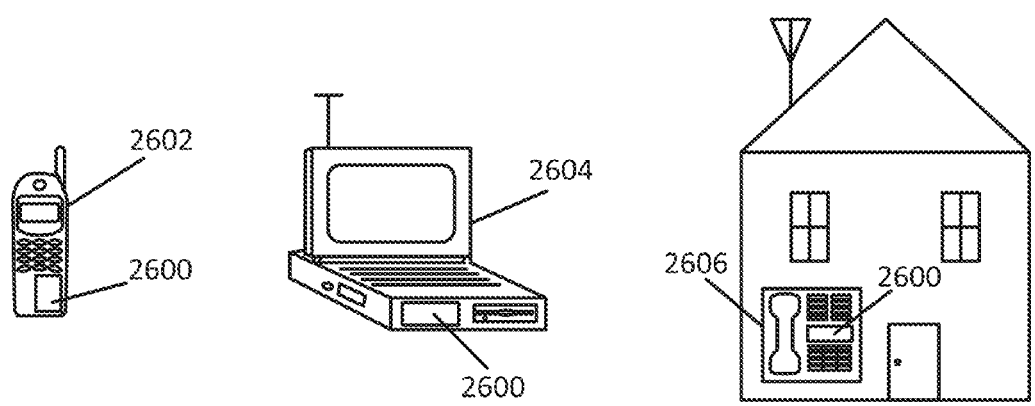
FIG. 26 illustrates various electronic devices that may include an integrated circuit (IC) package, a semiconductor device, a die, an integrated circuit (IC), a substrate and/or a PCB described herein.

FIG. 26 illustrates various electronic devices that may be integrated with any of the aforementioned integrated device, semiconductor device, integrated circuit, die, interposer, package, package or package-on-package (PoP). For example, a mobile phone device 2602, a laptop computer device 2604, and a fixed location terminal device 2606 may include an integrated device 2600 as described herein. The integrated device 2600 may be, for example, any of the integrated circuits, dies, integrated devices, integrated circuit packages, integrated circuit devices, package-on-package devices described herein. The devices 2602, 2604, 2606 illustrated in FIG. 26 are merely exemplary. Other electronic devices may also feature the integrated device 2600 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices, servers, routers, Internet of Things (IoT) devices, electronic devices implemented in automotive vehicles (e.g., autonomous vehicles), or any other device that stores or retrieves data or computer instructions, or any combination thereof.

One or more of the components, steps, features, and/or functions illustrated in FIGS. 2, 3, 4, 5, 6, 7, 8, 9, 10, 11, 12, 13, 14, 15, 16, 17, 18, 19, 20, 21, 22, 23, 24A-24B, 25 and/or 26 may be rearranged and/or combined into a single component, step, feature or function or embodied in several components, steps, or functions. Additional elements, components, steps, and/or functions may also be added without departing from the disclosure. It should also be noted that FIGS. 2, 3, 4, 5, 6, 7, 8, 9, 10, 11, 12, 13, 14, 15, 16, 17, 18, 19, 20, 21, 22, 23, 24A-24B, 25 and/or 26 and its corresponding description in the present disclosure is not limited to dies and/or ICs. In some implementations, FIGS. 2, 3, 4, 5, 6, 7, 8, 9, 10, 11, 12, 13, 14, 15, 16, 17, 18, 19, 20, 21, 22, 23, 24A-24B, 25 and/or 26 and its corresponding description may be used to manufacture, create, provide, and/or produce integrated devices. In some implementations, a device may include a die, a die package, an integrated circuit (IC), an integrated device, an integrated circuit package, a wafer, a semiconductor device, a package on package structure, and/or an interposer.

The word "exemplary" is used herein to mean "serving as an example, instance, or illustration," Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another even if they do not directly physically touch each other.

Also, it is noted that the embodiments may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. A coupled toroid inductor comprising:
a first toroid inductor and a second toroid inductor, wherein the first toroid inductor is separate from and co-planar with the second toroid inductor along a multi-layer dielectric substrate, the first and/or second toroid inductors comprising:
(i) a plurality of first turns configured in a first ring shape, the plurality of first turns comprising:
a plurality of first upper interconnects, wherein the plurality of first upper interconnects includes individual substantially rectangular trace segments on a first metal layer of the multi-layer dielectric substrate;
a plurality of first lower interconnects, wherein the plurality of first lower interconnects includes individual substantially rectangular trace segments on a second metal layer of the multi-layer dielectric substrate; and
a plurality of first vias coupled to the plurality of first upper interconnects and to the plurality of first lower interconnects; and
(ii) a plurality of second turns at least partially intertwined with the plurality of first turns, wherein the plurality of second turns is configured in a second ring shape, the plurality of second turns comprising:
a plurality of second upper interconnects, wherein the plurality of second upper interconnects includes individual substantially rectangular trace segments on the first metal layer of the multi-layer dielectric substrate;
a plurality of second lower interconnects, wherein the plurality of second lower interconnects includes individual substantially rectangular trace segments on the second metal layer of the multi-layer dielectric substrate; and
a plurality of second vias coupled to the plurality of second upper interconnects and to the plurality of second lower interconnects,
wherein the at least partial intertwining of at least some of the first turns and second turns form an enclosure for the multi-layer dielectric substrate configured to reduce electromagnetic field leakage from the toroid inductor.

2. The toroid inductor of claim 1, wherein the plurality of first turns comprises a first turn, and wherein the first turn comprises:
a first inner via,
a first upper interconnect coupled to the first inner via;
a first outer via coupled to the first upper interconnect;
a second outer via coupled to the first upper interconnect; and
a first lower interconnect coupled to the first outer via and the second outer via.

3. The toroid inductor of claim 2, wherein the plurality of second turns comprises a second turn, and wherein the second turn comprises:
a second inner via,
a second upper interconnect coupled to the second inner via;
a third outer via coupled to the second upper interconnect;
a fourth outer via coupled to the second upper interconnect; and
a second lower interconnect coupled to the third outer via and the fourth outer via.

4. The toroid inductor of claim 3, wherein the second turn is intertwined with the first turn.

5. The toroid inductor of claim 1, wherein the first ring shape comprises a circular ring shape or an oval ring shape.

6. The toroid inductor of claim 1, wherein the first toroid inductor comprises the plurality of first turns, and the second toroid inductor comprises the plurality of second turns.

7. The toroid inductor of claim 1, wherein the first toroid inductor comprises a first terminal and a second terminal, and the second toroid inductor comprises a third terminal and a fourth terminal.

8. The toroid inductor of claim 1, wherein the first toroid inductor comprises a first terminal and a second terminal, and the second toroid inductor comprises the first terminal and a third terminal, such that the first toroid inductor and the second toroid inductor share the first terminal.

9. The toroid inductor of claim 1, wherein at least one interconnect from the first plurality of first upper interconnects comprises an L shape or an approximate L shape.

10. The toroid inductor of claim 1, wherein at least one interconnect from the plurality of first upper interconnects comprises a trace and a pad.

11. The toroid inductor of claim 1, wherein the toroid inductor is implemented into a device selected from the group consisting of an integrated device, an integrated circuit (IC) module, an integrated circuit (IC) package, a die, a substrate, an interposer and/or a printed circuit board (PCB).

12. The toroid inductor of claim 1, wherein the toroid inductor is incorporated into a device selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an Internet of Things (IoT) device and a device in a automotive vehicle, and further including the device.

13. A coupled toroid inductor comprising:
a first toroid inductor and a second toroid inductor, wherein the first toroid inductor is separate from and co-planar with the second toroid inductor along a multi-layer dielectric substrate, the first and/or second toroid inductors comprising:
a plurality of first turns at least partially intertwined with a plurality of second turns configured in a first ring shape, the plurality of first turns comprising:
a plurality of first upper interconnects, wherein the plurality of first upper interconnects includes individual, substantially rectangular, trace segments on a first metal layer of the multi-layer dielectric substrate;
a plurality of first lower interconnects, wherein the plurality of first lower interconnects includes individual, substantially rectangular, trace segments on a second metal layer of the multi-layer dielectric substrate; and
a plurality of first vias coupled to the plurality of first upper interconnects and to the plurality of first lower interconnects,
wherein the plurality of first turns comprises a first turn, and wherein the first turn comprises:
a first inner via;
a first upper interconnect coupled to the first inner via;
a first outer via coupled to the first upper interconnect;
a second outer via coupled to the first upper interconnect; and
a first lower interconnect coupled to the first outer via and the second outer via, wherein the at least partial intertwining of at least some of the first turns and second turns form an enclosure for the multi-layer dielectric substrate configured to reduce electromagnetic field leakage from the toroid inductor.

14. The toroid inductor of claim 13, wherein at least one of the plurality of second turns comprises:
a second inner via,
a second upper interconnect coupled to the second inner via;
a third outer via coupled to the second upper interconnect;
a fourth outer via coupled to the second upper interconnect; and
a second lower interconnect coupled to the third outer via and the fourth outer via.

15. The toroid inductor of claim 1, wherein the individual rectilinear trace segments of the plurality of first upper interconnects crosses only one individual rectilinear trace segments of the plurality of first lower interconnects.

16. The toroid inductor of claim 1, wherein the individual rectilinear trace segments of the plurality of second upper interconnects crosses only one individual rectilinear trace segments of the plurality of second lower interconnects.

* * * * *